(12) United States Patent
Yabe

(10) Patent No.: US 12,260,921 B2
(45) Date of Patent: Mar. 25, 2025

(54) SENSE AMPLIFIER ARCHITECTURE PROVIDING REDUCED PROGRAM VERIFICATION TIME

(71) Applicant: SanDisk Technologies LLC, Addison, TX (US)

(72) Inventor: Hiroki Yabe, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 177 days.

(21) Appl. No.: 17/838,072

(22) Filed: Jun. 10, 2022

(65) Prior Publication Data

US 2023/0402111 A1   Dec. 14, 2023

(51) Int. Cl.
| | | |
|---|---|---|
| *G11C 16/04* | (2006.01) | |
| *G11C 7/06* | (2006.01) | |
| *G11C 7/10* | (2006.01) | |
| *G11C 16/10* | (2006.01) | |
| *G11C 16/24* | (2006.01) | |
| *G11C 16/26* | (2006.01) | |
| *G11C 16/32* | (2006.01) | |
| *G11C 16/34* | (2006.01) | |

(52) U.S. Cl.
CPC .......... *G11C 16/3459* (2013.01); *G11C 7/065* (2013.01); *G11C 7/1048* (2013.01); *G11C 16/102* (2013.01); *G11C 16/24* (2013.01); *G11C 16/26* (2013.01); *G11C 16/32* (2013.01)

(58) Field of Classification Search
CPC ... G11C 16/3459; G11C 7/065; G11C 7/1048; G11C 16/102; G11C 16/24; G11C 16/26; G11C 16/32
See application file for complete search history.

(56) References Cited

U.S. PATENT DOCUMENTS

| | | | | |
|---|---|---|---|---|
| 11,087,800 B1* | 8/2021 | Yabe | ...................... | G11C 16/10 |
| 2009/0040835 A1* | 2/2009 | Ogawa | ................... | G11C 16/24 |
| | | | | 365/207 |
| 2013/0343124 A1* | 12/2013 | Ma | ...................... | G11C 11/5642 |
| | | | | 365/185.02 |
| 2022/0157351 A1* | 5/2022 | Lin | ........................ | G11C 7/062 |

* cited by examiner

*Primary Examiner* — Pho M Luu
(74) *Attorney, Agent, or Firm* — Sheppard Mullin Richter & Hampton LLP

(57) ABSTRACT

Systems and methods are provided for sensing a data state of a memory cell. In an example implementation, systems and methods disclosed herein perform a method that includes connecting a first sensing node and a second sensing node to a bitline of a sensing amplifier to simultaneously discharge first and second capacitors connected to the first and second sensing nodes, respectively, through the memory cell. After a first sensing period, the second sensing node is disconnected from the bitline, which includes a first voltage level based on discharging the second capacitor. After a second sensing period, the first sensing node is disconnected from the bitline, which includes a second voltage level based on discharging the first capacitor. First and second sensing results are latched based on the first and second voltage levels, respectively, and a data state of the memory cell is based on the first and second voltage levels.

20 Claims, 21 Drawing Sheets

SENSE AMPLIFIER ARCHITECTURE PROVIDING REDUCED PROGRAM VERIFICATION TIME

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

In EEPROM and flash memory architecture, memory cells may be arranged in a matrix of rows and columns, such that gates of each memory cell are coupled by rows to wordlines. The memory cells may be arranged together in strings such that memory cells in a given string are coupled together in series, from source to drain, between a common source line and a common bitline.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
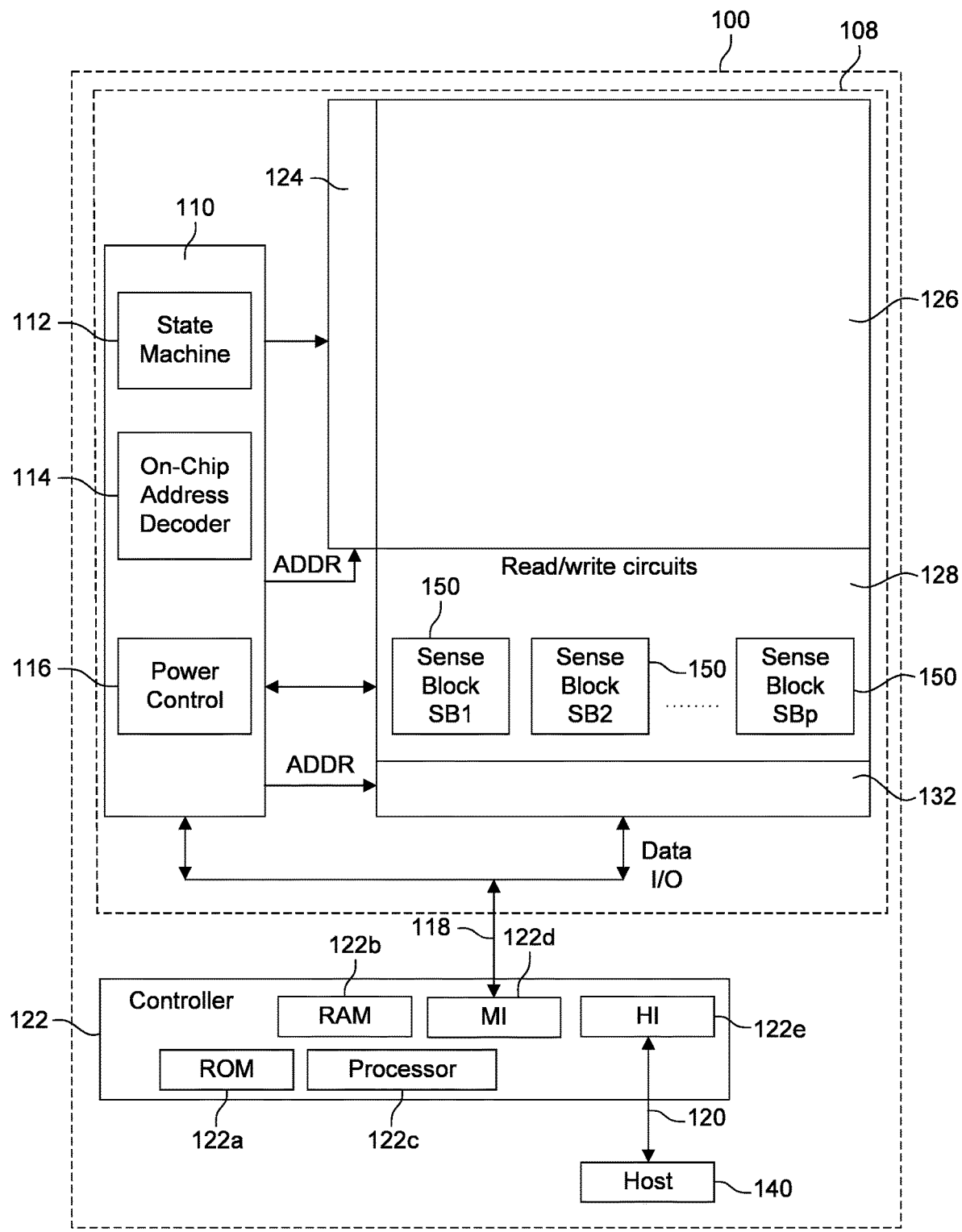
FIG. 1 is a block diagram of an example memory device, in connection with which, example embodiments of the disclosed technology can be implemented.

The figures are not exhaustive and do not limit the present disclosure to the precise form disclosed.

DETAILED DESCRIPTION

As described above, memory cells may be arranged together in an array of strings such that memory cells in a given string are coupled together in series, from source to drain, between a common source line and a common bitline. To program memory cells included in the array of memory strings, a programming operation may be performed to apply a series of program voltages to the memory cells after the memory cells are provided in an erased state. Each program voltage is provided in a program loop, also referred to as a program-verify iteration. For example, the program voltage may be applied to a wordline which is connected to control gates of the memory cells. In one approach, incremental step pulse programming is performed, where the program voltage is increased by a step size in each program loop. When programming is completed for a memory cell, it can be locked out from further programming while programming continues for other memory cells in subsequent program loops.

Each memory cell may be associated with a data state according to write data in a program command. A memory cell can be in an erased data state (referred to herein as an erased state) or can be programmed to a programmed data state (referred to herein as a programmed state) that is different from the erased state. For example, in a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states. In a four-bit per cell memory device, there are sixteen data states including the erased state and fifteen programmed data states referred to as the Er, 1, 2, 3, 4, 5, 6, 7, 8, 9, A, B, C, D, E and F data states.

When a program command is issued, the write data is stored in latches associated with the memory cells. During programming, the latches of a memory cell can be read to determine the data state to which the cell is to be programmed. Each memory cell is considered to have completed programming when a sensing operation determines that a threshold voltage (Vth) is satisfied by (e.g., above) the associated verify voltage level. A sensing operation can determine whether a memory cell has a voltage level above the associated verify voltage level by applying a voltage to the control gate of the memory cell and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

When programming memory cells, it is important to perform a program-verify operation in a way that is both fast and accurate. As described below, many techniques or configurations are able to achieve fast programming, or accurate programming, but are unable to achieve both. To program memory cells accurately, a Vth distribution for each data state must be sufficiently spaced apart. This reduces the likelihood of a higher voltage of one Vth distribution overlapping with a voltage of another Vth distribution. This overlap can occur because of disturbances, such as noise, variance in temperature of the integrated circuit, and/or the like. Furthermore, overlap in Vth distributions can lead to run-time errors (e.g., a bit with a value of zero could be mistakenly read as having a value of one). Consequently, it is useful to have narrow Vth distributions that are less likely to be impacted by disturbances and less likely to cause run-time errors.

However, controlling Vth distribution width can be difficult given that memory cells program at different rates. For example, a first memory cell that programs faster than a second memory cell will require less programming pulses to complete programming. This causes a first Vth distribution for the first memory cell to be different than a second Vth distribution for the second memory cell. This may bring the Vth distributions closer together, thereby increasing a likelihood of memory cells being impacted by disturbances.

One solution is to implement a multistep verify (MSV) operation. The MSV operation is a two-step sense operation, where a threshold voltage of a memory cell is verified based on different verify voltages applied during each sense operation. Once a threshold voltage for a memory cell is verified at a first verify voltage level (referred to herein as VL) during a first sense operation, a second sense operation is performed to verify the threshold voltage at a second verify voltage level (referred to herein as VH). However, the MSV operation is inefficient as it requires an additional verification steps in order to program the memory cells. For example, the amount of time to complete a verification of a data state as part of programming a memory cell is dependent upon the time of the wordline setup, bitline settling, and times for a threshold voltage of a memory cell to reach verify voltage levels. Conventionally, verification that the threshold voltage of the memory cell has reached the verify level VH is performed once the threshold voltage of the memory cell is verified at the verify level VL. Thus, verification of the VH level may be bottlenecked by the setup of the wordline, bitline settling, and the speed at which the threshold voltage of the memory cell can be verified at the verify voltage level VL. This bottlenecking slows the programming of all bits that remain to be programmed, thus increasing the total programming time.

Another solution to create narrower Vth distributions is to implement a quick pass write (QPW) technique. The QPW technique involves changing a bit-line level for memory cells that are close to a verify voltage level VH so that the memory cells appear as if a programming pulse step is reduced. If a threshold voltage of a memory cell is above the verify voltage level VL and below the verify voltage level VH, it is considered "close to verify voltage level VH" and is designated as QPW state. Such memory cells have a bitline voltage of VQPW (e.g., an intermediate voltage between 0V and 2.2Vm), whereas memory cells in the programmed state have a bitline voltage of VSS (e.g., 0V) and memory cells in an inhabit state have a bitline voltage of VDDSA (e.g., typically 2.2V). Thus, when a faster-programming memory cell is within a threshold range of the programmed state, the programming pulse step voltage appears to be adjusted to slow the rate at which the memory cell is programmed.

Some modifications to the QPW technique allow for faster programming times but at the expense of accuracy. Rough QPW techniques may include a smart QPW (SQPW) operation, a floating QPW (FQPW) technique, and/or the like. To provide an example, SQPW is a technique where the verify voltage VL and the verify voltage VH are sensed in one-bit-pass (OBP) operation by modulating a threshold voltage using a VLOP node. However, as explained below in connection with FIGS. 14A and 14B, the SQPW operation reduces the voltage swing for distinguishing between data states, thereby opening the sensing operations to vulnerability due to nose that could increase inaccuracies in verification of the threshold voltage.

Accordingly, embodiments of the disclosed technology, relate to systems, devices, circuits, methods, computer-readable media, and techniques for performing program-verify operations to determine whether a selected memory cells is in a programmable state, a QPW programed state (or weakly programed state), or a program inhibit state by performing a single pass operation that can verify the threshold voltage of the memory cell at two verify voltage levels. The single pass operation, according to example embodiments of the disclosed technology, uses a first and second sensing capacitors connected by a switch therebetween to perform program-verify operations at the verify voltage level VL and verify voltage level VH in one operation. Embodiments herein provide for simultaneously discharging both capacitors through a selected memory. After a first sensing period corresponding to the verify voltage level VL, the second sensing capacitor is disconnected from the memory cell via the switch and no longer discharges, thereby retaining a first voltage level of the memory cell. After a second sensing period corresponding to the verify voltage level VH, the first sensing capacitor is disconnected from the memory cell and no longer discharges, thereby retaining a second voltage level of the memory cell. The first voltage level corresponds to a first sensing result that is latched into a data latch. Once the first sensing result is latched into the data latch, the second voltage level is transferred to the second capacitor through the switch and then latched into another data latch. If the first voltage level is above the verify voltage level VH, the memory cell is considered to be in the inhibit state. If the first voltage level is above the verify voltage level VL but the second voltage level is below the verify voltage level VH (e.g., is equal to or below), the memory cell is considered to be in a weakly programmed state. If the first voltage level is below the verify voltage level VL, the memory cell is considered to be in the programmable state. Note that the verify voltage level VL is below the verify voltage level VH because the verify voltage level VL corresponds to shorter sensing period.

Accordingly, embodiments herein provide a technical solution to a technical problem associated existing program-verify operations, for example, by simultaneously discharging two sensing capacitors which avoids the requirement that VL verification be completed prior to initiating VH verification. Thus, the bottleneck of the VH sensing due to VL sensing (e.g., a VL to VH distance) is avoided and program verification time is reduced. Further, by using two capacitors and one sensing operation, the voltage swing for the VH and VL verification can be kept the same. Thus, inaccuracies due to noise resulting from a reduced swing voltage are minimized. Further still, the second voltage level that is verified using the verify voltage level VH is transferred to the second sensing capacitor under the same conditions used to discharge the two sensing capacitors. As such, constant sensing errors are avoided.

FIGS. 1 to 4H depict an example memory system that can be used to implement the technology disclosed herein. FIG. 1 is a functional block diagram of an example memory system 100. The components depicted in FIG. 1 are electrical circuits. Memory system 100 includes one or more memory dies 108, referred to hereinafter in the singular for ease of explanation. The memory die 108 can be a complete memory die or a partial memory die. In one embodiment, each memory die 108 includes a memory structure 126, control circuitry 110, and read/write circuits 128. Memory structure 126 is addressable by wordlines via a row decoder 124 and by bitlines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the memory die 108. However, in other systems, the controller can be separated from the memory die 108. In some embodiments the controller is on a different die than the memory die 108. In some embodiments, one controller 122 communicates with multiple memory dies 108. In other embodiments, each memory die 108 has its own controller. Commands and data are transferred between a host 140 and controller 122 via a data bus 120, and between controller 122 and the memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase) on memory structure 126, and includes state machine 112, an on-chip address decoder 114, and a power control circuit 116. In one embodiment, control circuitry 110 includes buffers such as registers, read-only memory (ROM) fuses and other storage devices for storing default values such as base voltages and other parameters.

The on-chip address decoder 114 provides an address interface between addresses used by host 140 or controller 122 and the hardware address used by the decoders 124 and 132. Power control circuit 116 controls the power and voltages supplied to the wordlines, bitlines, and select lines during memory operations. The power control circuit 116 includes voltage circuitry, in one embodiment. Power control circuit 116 may include charge pumps for creating voltages. The sense blocks 150 include bitline drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. Such a control circuit can include hardware only or a combination of hardware and software (including firmware). For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally.

The (on-chip or off-chip) controller 122 (which in one embodiment is an electrical circuit) may comprise one or more processors 122c, ROM 122a, random access memory (RAM) 122b, a memory interface (MI) 122d, and a host interface (HI) 122e, all of which may be interconnected. The storage devices (ROM 122a, RAM 122b) store code (software) such as a set of instructions (including firmware), and one or more of the processors 122c are operable to execute the set of instructions to provide functionality described herein. Alternatively or additionally, one or more processors 122c can access code from a storage device in the memory structure, such as a reserved area of memory cells connected to one or more wordlines. RAM 122b can be used to store data for controller 122, including caching program data (discussed below). MI 122d—in communication with ROM 122a, RAM 122b, and processor(s) 122c— may be an electrical circuit that provides an electrical interface between controller 122 and memory die 108. For example, MI 122d can change the format or timing of signals, provide a buffer, isolate from surges, latch I/O, etc. One or more processors 122c can issue commands to control circuitry 110 (or another component of memory die 108) via MI 122d. Host interface 122e provides an electrical interface with host 140 via data bus 120 in order to receive commands, addresses and/or data from host 140 to provide data and/or status to host 140.

In one embodiment, memory structure 126 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 126 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 126 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
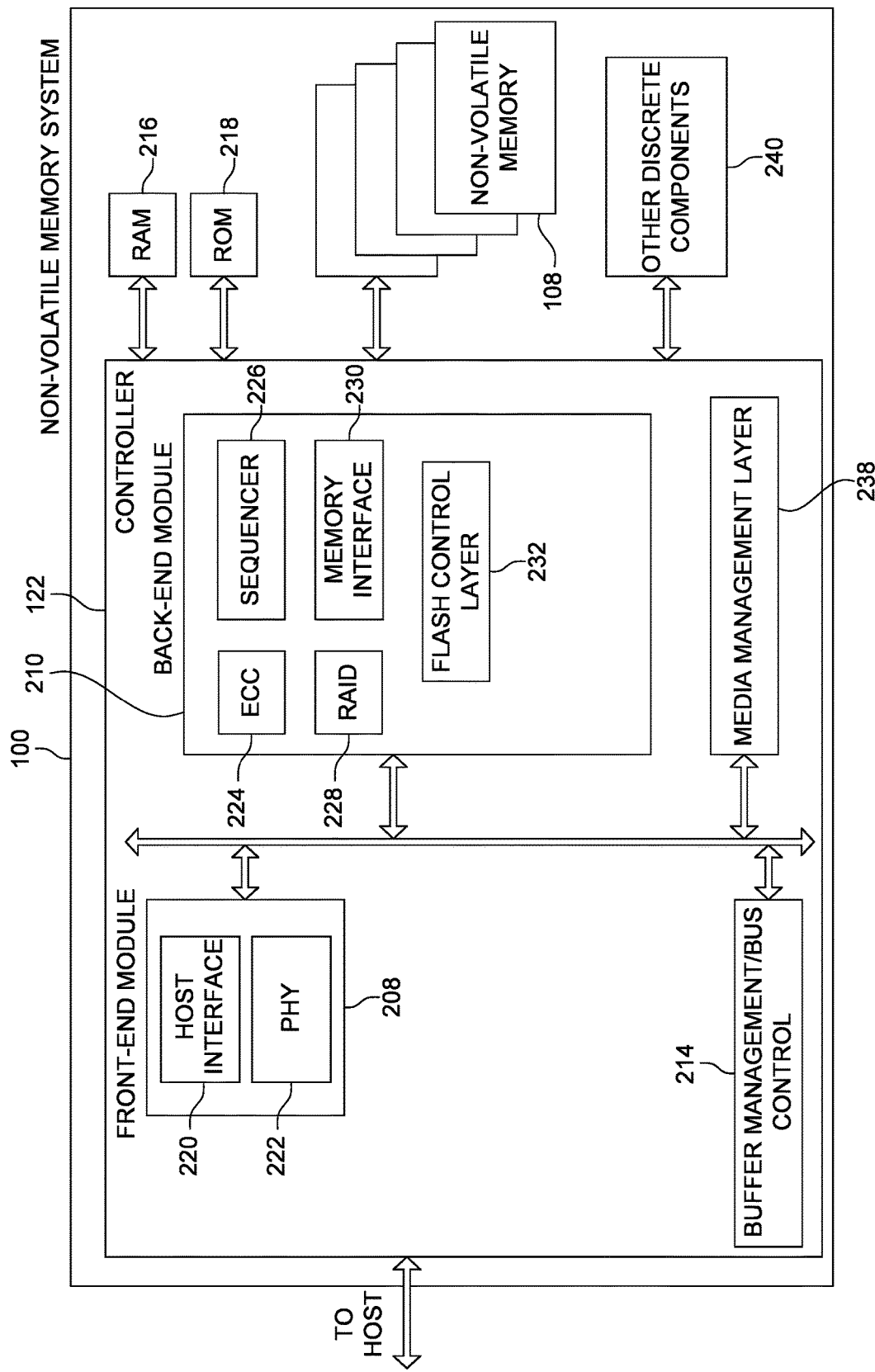
FIG. 2 is a block diagram of an example memory system, in connection with which, example embodiments of the disclosed technology can be implemented.

FIG. 2 is a block diagram of example memory system 100 that depicts more details of one embodiment of controller 122. While the controller 122 in the embodiment of FIG. 2 is a flash memory controller, it should be appreciated that non-volatile memory 108 is not limited to flash memory. Thus, the controller 122 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other examples, memory system 100 can be a solid state drive (SSD).

In some embodiments, non-volatile memory system 100 includes a single channel between controller 122 and non-volatile memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2, controller 122 includes a front-end module 208 that interfaces with a host, a back-end module 210 that interfaces with the memory die 108, and various other modules that perform functions which will now be described in detail. The components of controller 122 depicted in FIG. 2 may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable controller 122 to perform the functions described herein. The architecture depicted in FIG. 2 is one example implementation that may (or may not) use the components of controller 122 depicted in FIG. 1 (e.g., RAM, ROM, processor, interface).

Referring again to modules of the controller 122, a buffer manager/bus control 214 manages buffers in RAM 216 and controls the internal bus arbitration of controller 122. ROM 218 stores system boot code. Although illustrated in FIG. 2 as located separately from the controller 122, in other embodiments, one or both of RAM 216 and ROM 218 may be located within the controller. In yet other embodiments, portions of RAM 216 and ROM 218 may be located within the controller 122, while other portions may be located outside the controller. Further, in some implementations, the controller 122, RAM 216, and ROM 218 may be located on separate semiconductor dies.

Front-end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 210 includes an error correction code (ECC) engine 224 that encodes the data bytes received from the host, and decodes and error corrects the data bytes read from the non-volatile memory 108. A command sequencer 226 generates command sequences, such as program and erase command sequences, to be transmitted to non-volatile memory 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as one or more extra dies, or may be added within the existing die, e.g., as an extra plane, an extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of system 100 illustrated in FIG. 2 include media management layer (MML) 238, which performs wear leveling of memory cells of non-volatile memory die 108, as well as, other discrete components 240, such as external electrical interfaces, external RAM, resistors, capacitors, or other components that may interface with controller 122. In alternative embodiments, one or more of the physical layer interface 222, RAID module 228, MML 238, or buffer management/bus controller 214 are optional components.

MML 238 (e.g., Flash Translation Layer (FTL)) may be integrated as part of the flash management for handling flash errors and interfacing with the host. In particular, MML 238 may be a module in flash management and may be responsible for the internals of NAND management. In particular, MML 238 may include an algorithm in the memory device firmware which translates writes from the host into writes to the memory 126 of die 108. MML 238 may be needed because: 1) the memory 126 may have limited endurance; 2) the memory 126 may only be written in multiples of pages; and/or 3) the memory 126 may not be written unless it is erased as a block (or a tier within a block in some embodiments). MML 238 understands these potential limitations of the memory 126 which may not be visible to the host. Accordingly, MML 238 attempts to translate the writes from host into writes into the memory 126.

Controller 122 may interface with one or more memory dies 108. In one embodiment, controller 122 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the non-volatile storage system 100 may include one memory die 108 connected to one controller 122. Other embodiments may include multiple memory dies 108 in communication with one or more controllers 122. In one example, the multiple memory dies 108 can be grouped into a set of memory packages. Each memory package may include one or more memory dies 108 in communication with controller 122. In one embodiment, a memory package includes a printed circuit board (or similar structure) with one or more memory dies 108 mounted thereon. In some embodiments, a memory package can include molding material to encase the memory dies 108 of the memory package. In some embodiments, controller 122 is physically separate from any of the memory packages.

Figure 3:
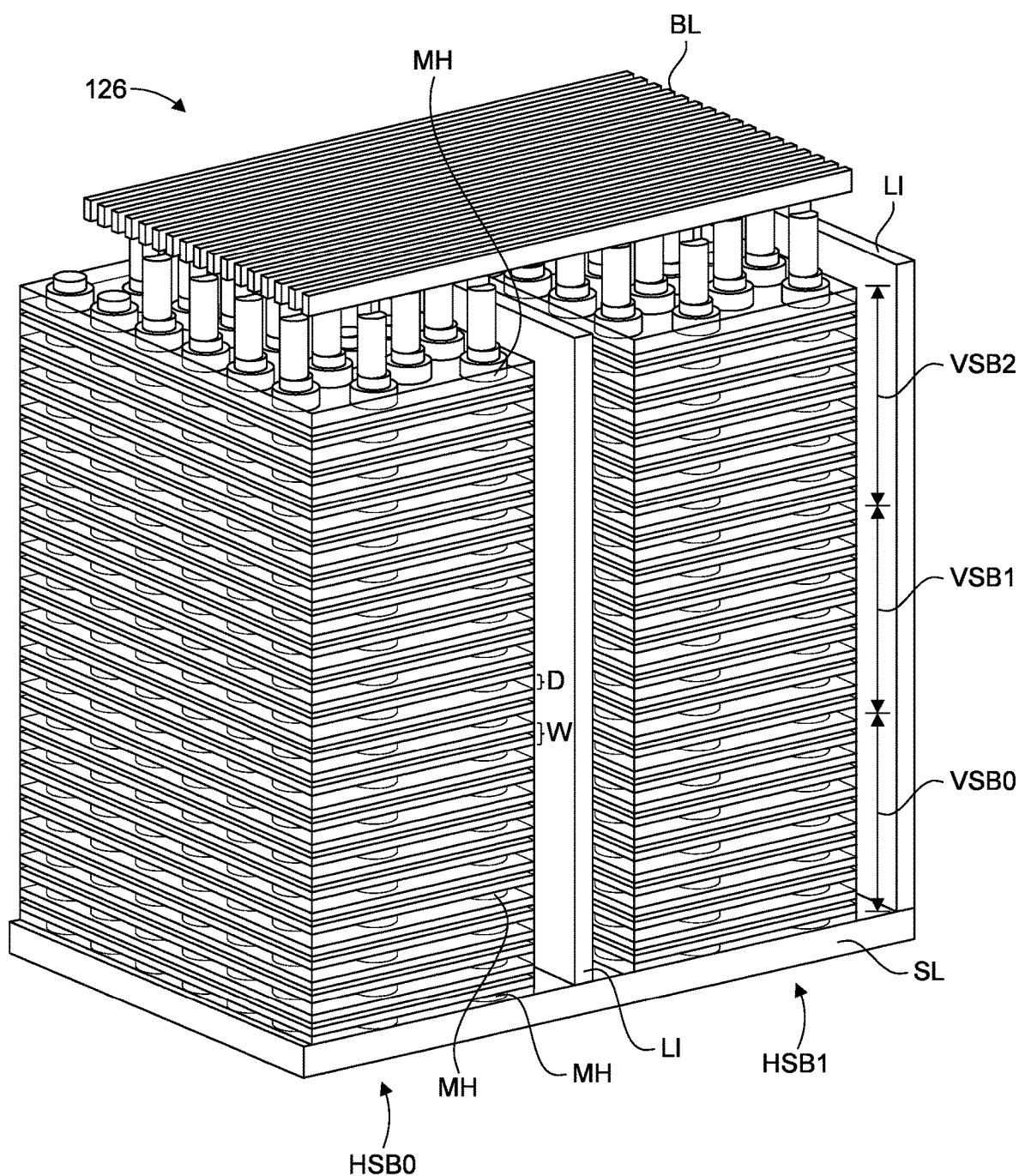
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 126 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 126 is provided below with respect to FIGS. 4A-4H.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
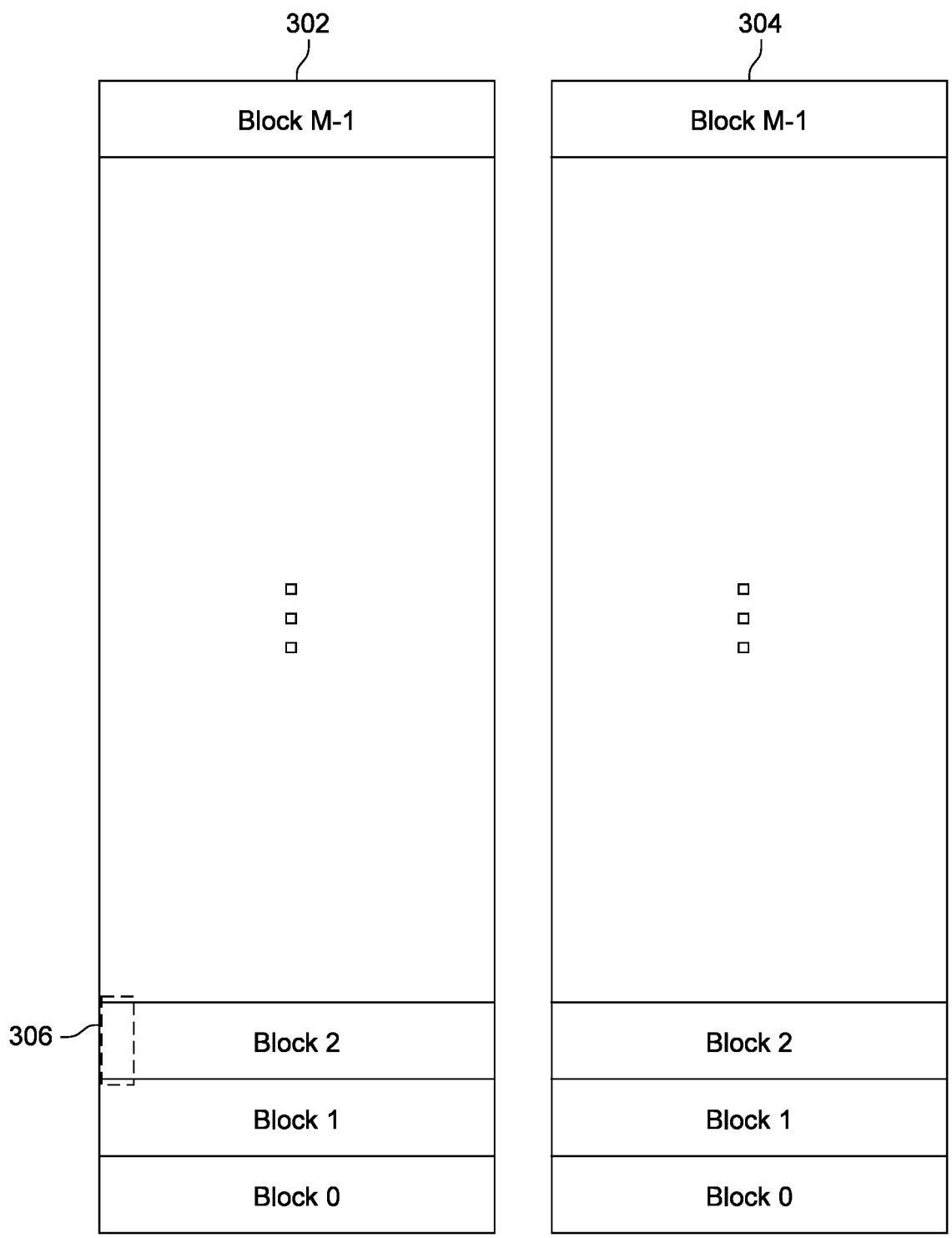
FIG. 4A is a block diagram of an example memory structure having two planes, in connection with which, example embodiments of the disclosed technology can be implemented.

FIG. 4A is a block diagram depicting one example organization of memory structure 126, which is divided into two planes 302 and 304. Each plane is then divided into M blocks. In one example, each plane has about 2000 blocks. However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 126 to enable the signaling and selection circuits. In some embodiments, a block represents a groups of connected memory cells that share a common set of wordlines.

Figure 4B:
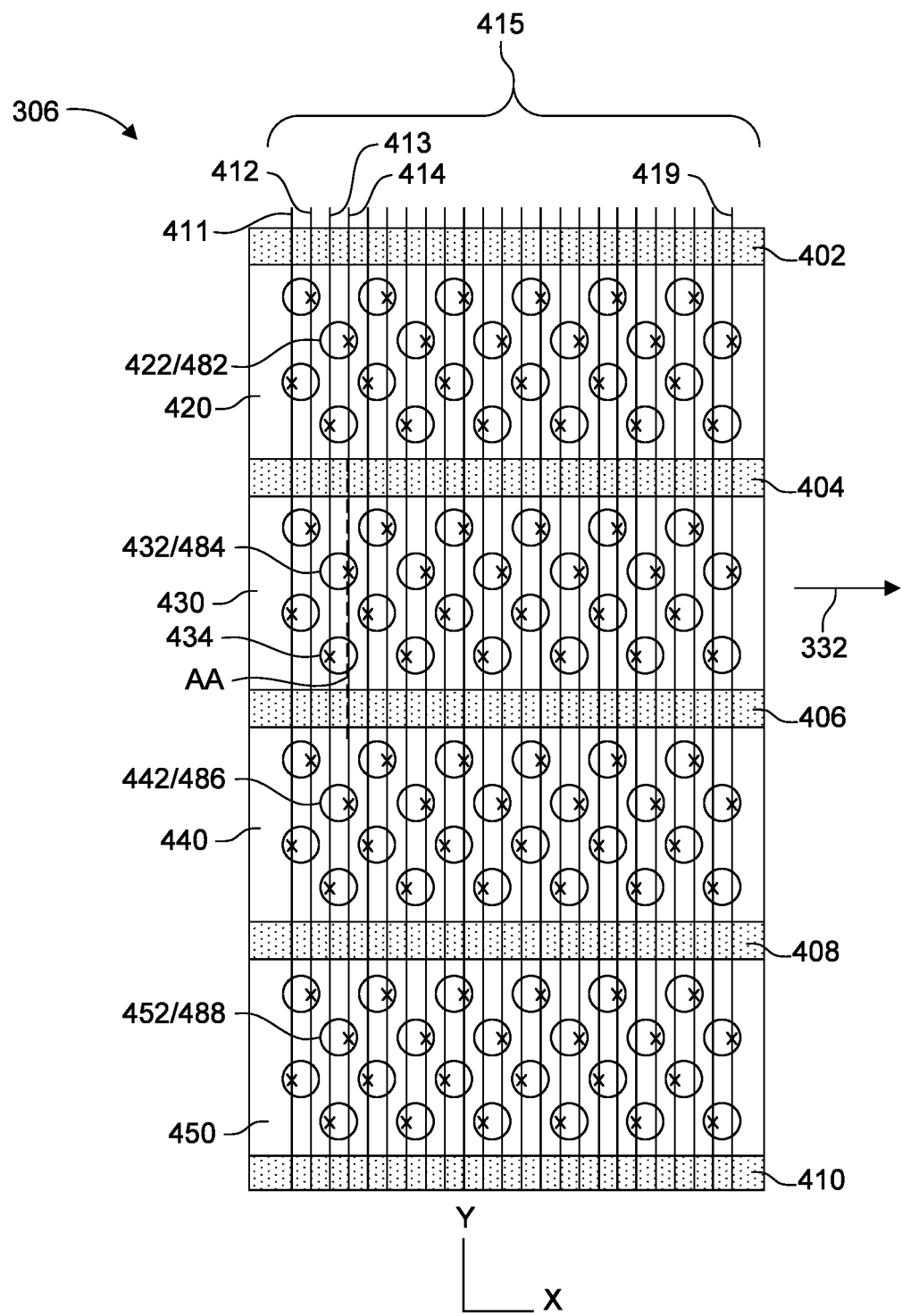
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 126 of FIG. 2. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
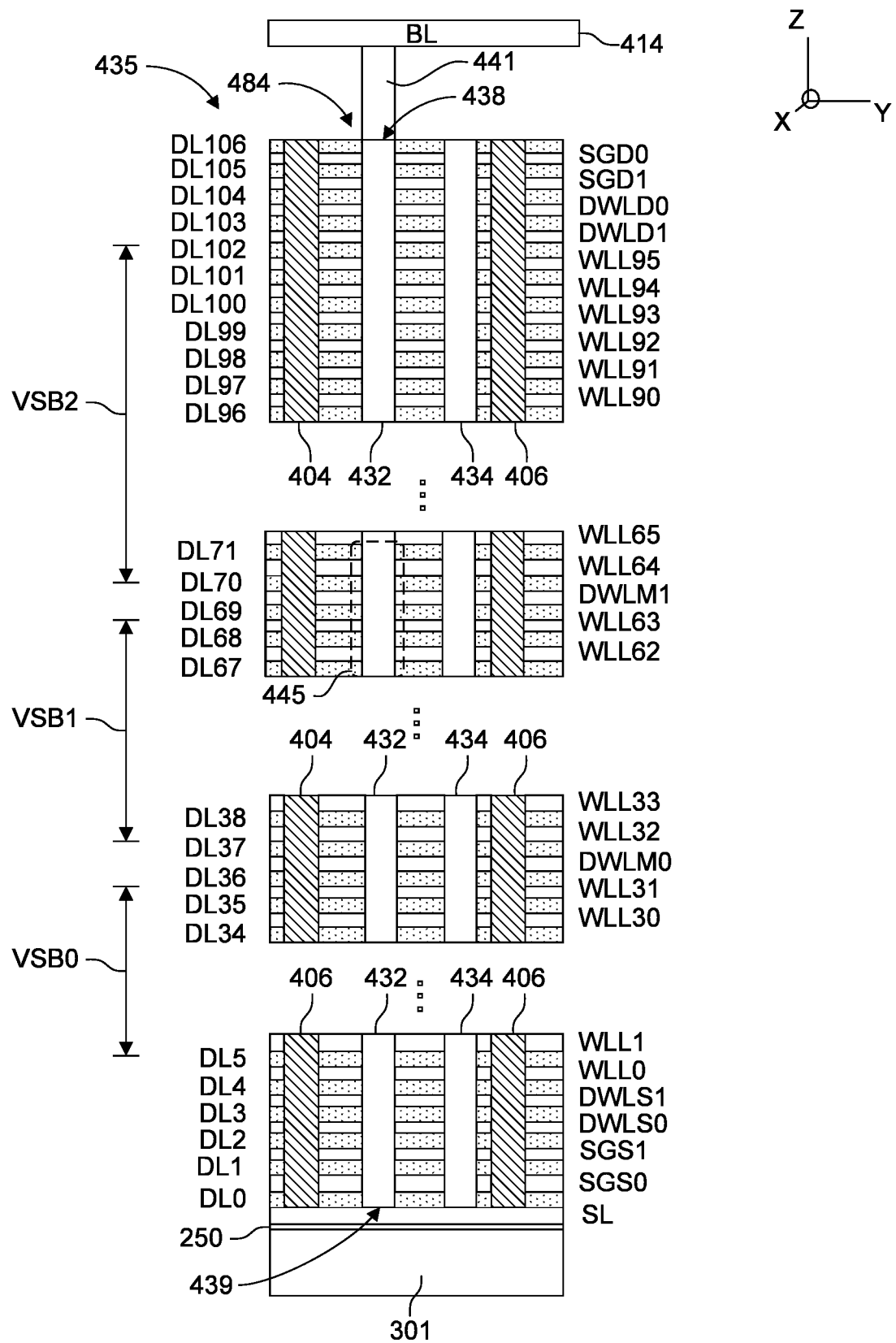
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
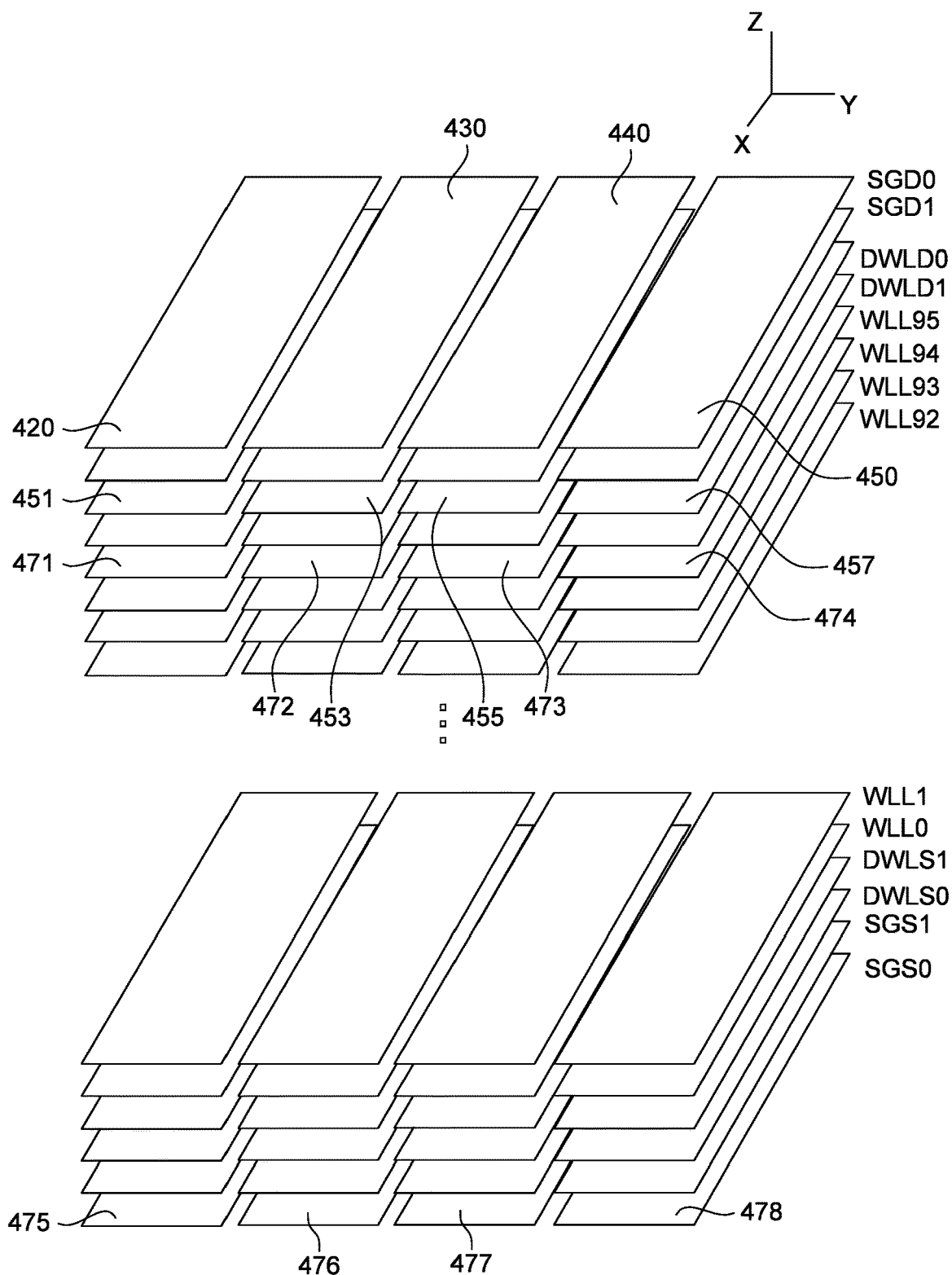
FIG. 4D depicts an alternative view of the select gate layers and wordline layers of the stack 435 of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
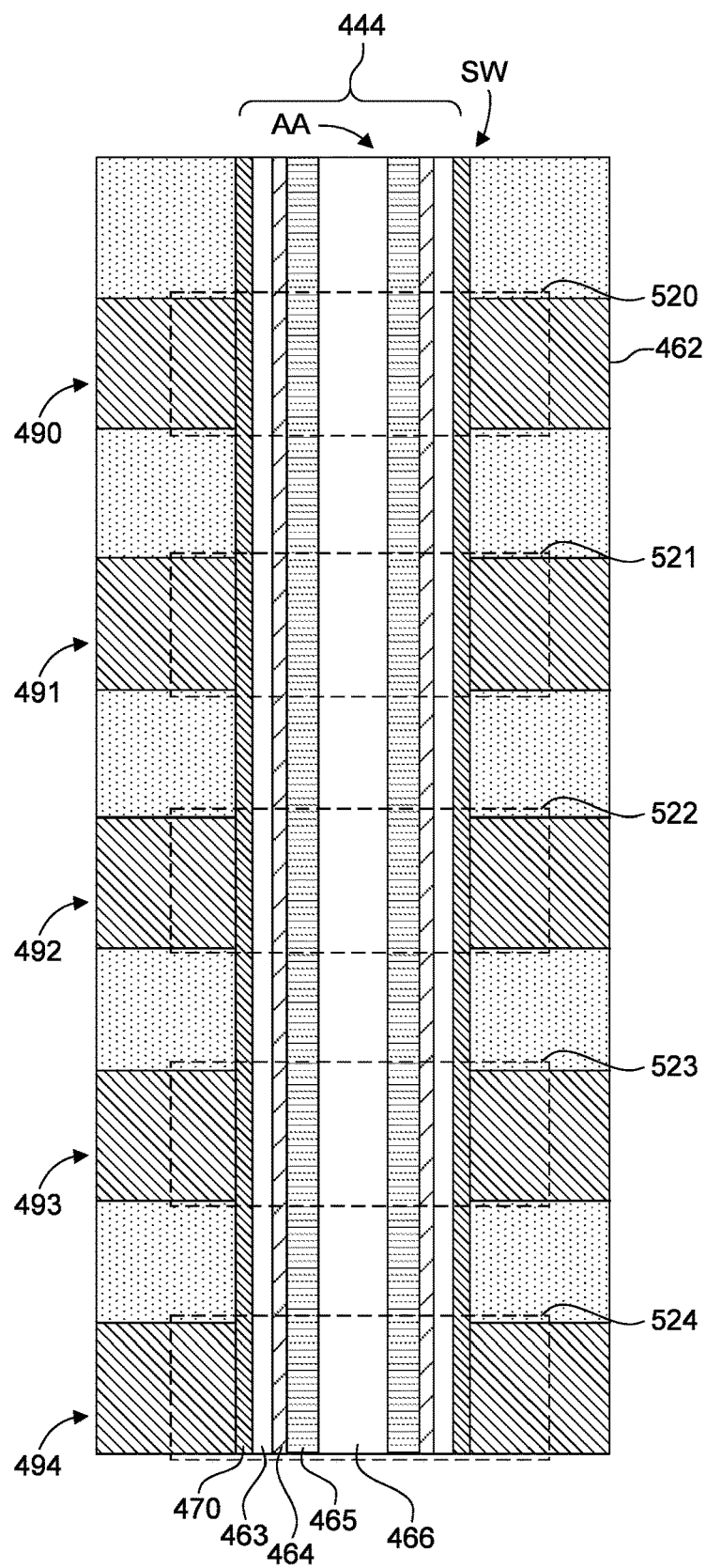
FIG. 4E depicts a view of the region 445 of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
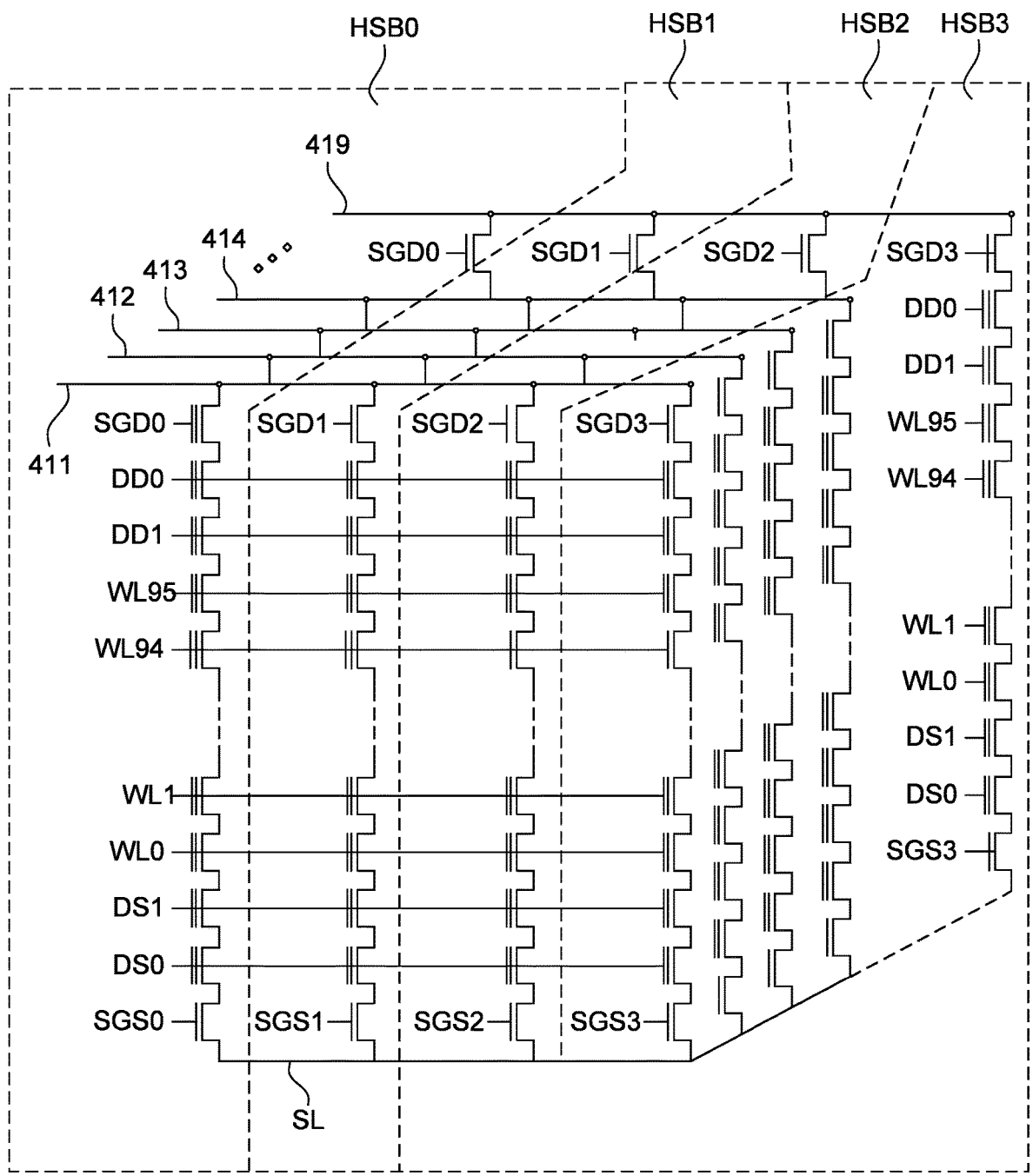
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, . . . 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
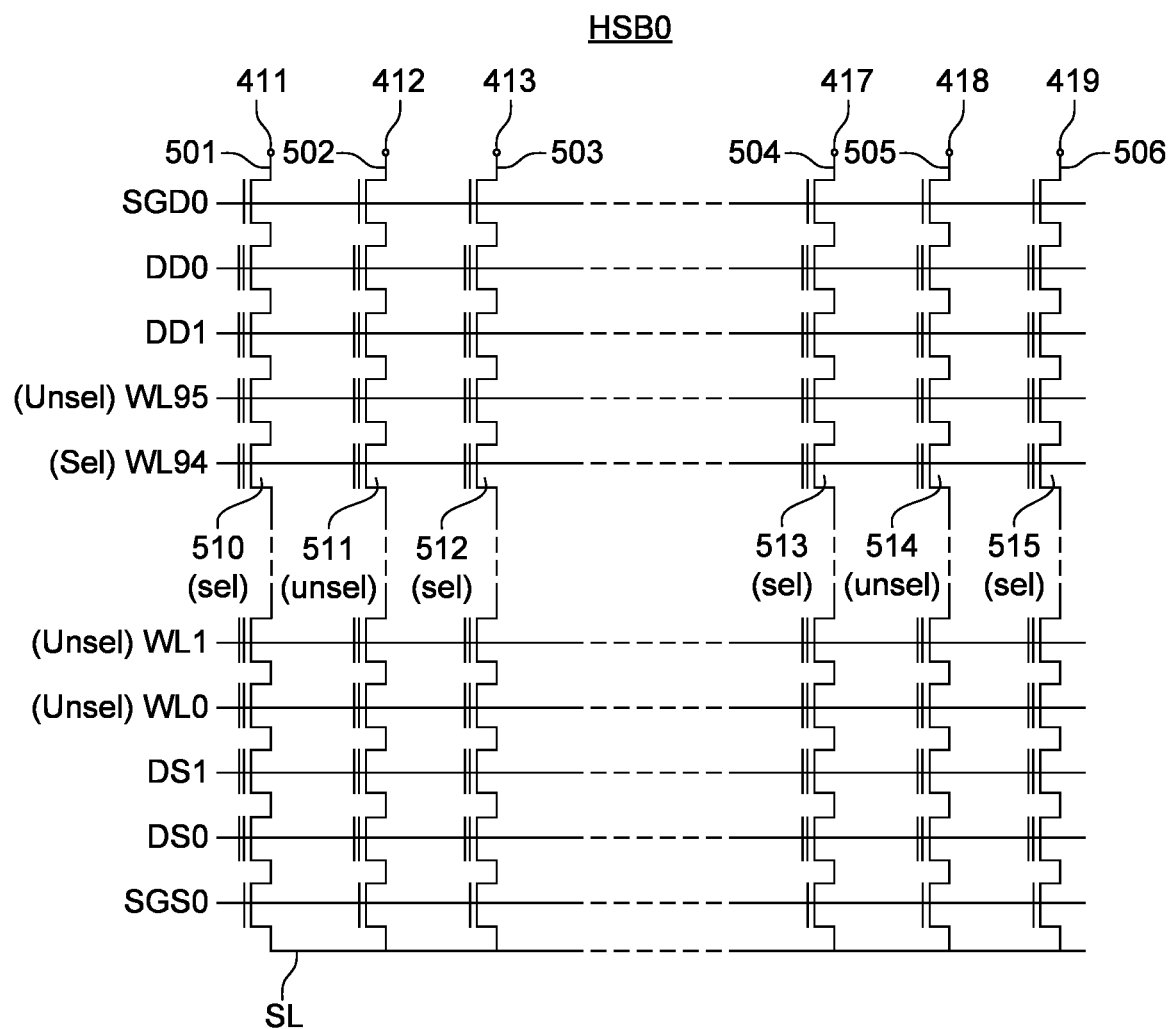
FIG. 4G is a schematic of a plurality of NAND strings showing one example horizontal sub-block, in connection with which, example embodiments of the disclosed technology can be implemented.
Figure 4H:
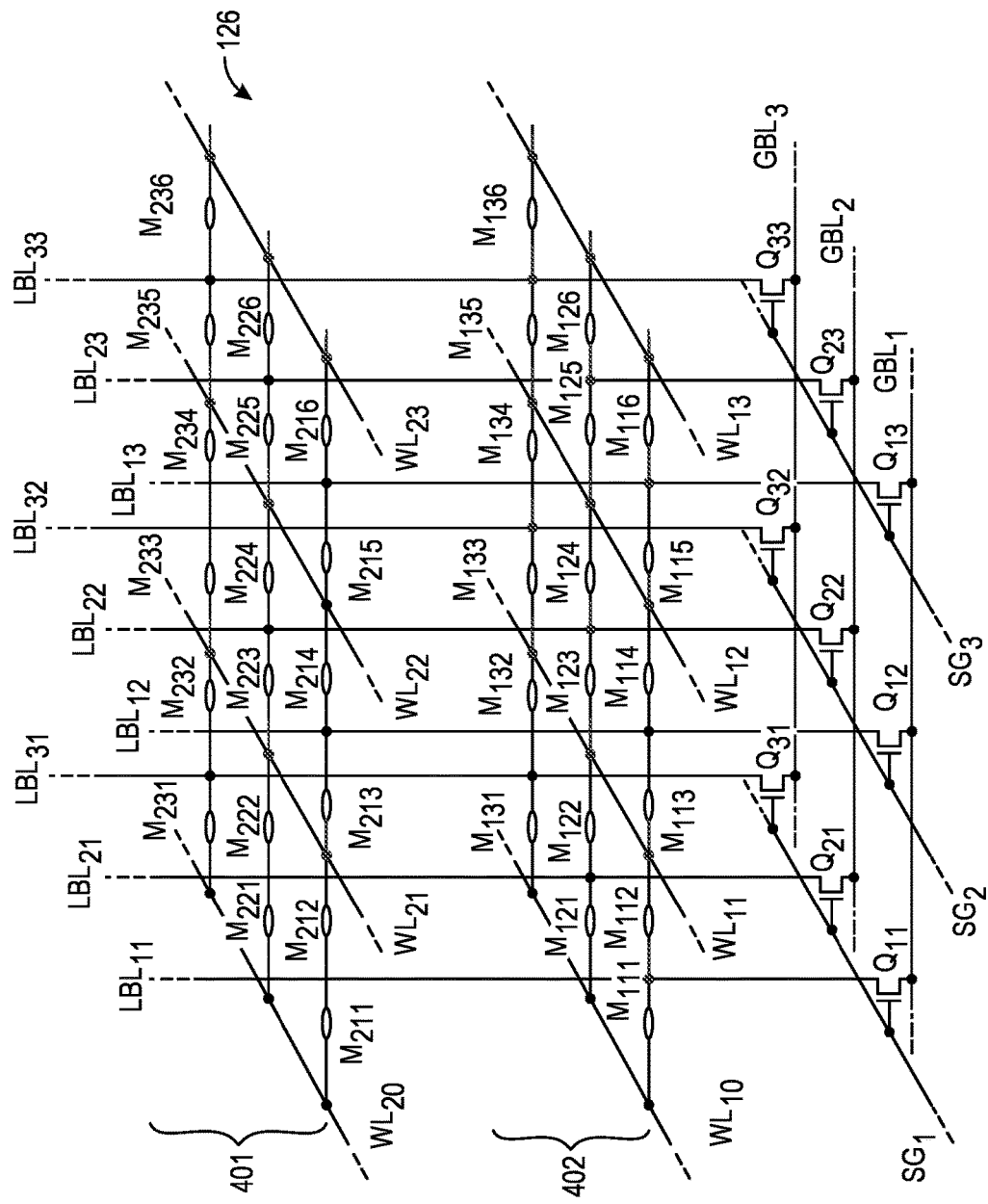
FIG. 4H depicts various embodiments of a portion of a three-dimensional memory array with a vertical cross-point structure, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unsel in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

FIG. 4H illustrates another memory structure that can be used for the structure 126 of FIG. 1A. FIG. 4H illustrates a three-dimensional vertical cross-point structure, the wordlines still run horizontally, with the bitlines oriented to run in a vertical direction.

FIG. 4H depicts one embodiment of a portion of a monolithic three-dimensional memory array structure 126 that includes a first memory level 402 positioned below a second memory level 401. As depicted, the local bitlines LBL11-LBL33 are arranged in a first direction (e.g., a vertical direction) and the wordlines WL10-WL23 are arranged in a second direction perpendicular to the first direction. This arrangement of vertical bitlines in a monolithic three-dimensional memory array is one embodiment of a vertical bitline memory array. As depicted, disposed between the intersection of each local bitline and each wordline is a particular memory cell (e.g., memory cell M111 is disposed between local bitline LBL11 and wordline WL10). This structure can be used with a number of different memory cell structures. In one example, the particular memory cell may include a floating gate device or a charge trap device (e.g., using a silicon nitride material). In another example, the particular memory cell may include a reversible resistance-switching material, a metal oxide, a phase change memory (PCM) material, or a ReRAM material. The global bitlines GBL1-GBL3 are arranged in a third direction that is perpendicular to both the first direction and the second direction. A set of bitline select devices (e.g., Q11-Q31), such as a vertical thin film transistor (VTFT), may be used to select a set of local bitlines (e.g., LBL11-

LBL31). As depicted, bitline select devices Q11-Q31 are used to select the local bitlines LBL11-LBL31 and to connect the local bitlines LBL11-LBL31 to the global bitlines GBL1-GBL3 using row select line SG1. Similarly, bitline select devices Q12-Q32 are used to selectively connect the local bitlines LBL12-LBL32 to the global bitlines GBL1-GBL3 using row select line SG2 and bitline select devices Q13-Q33 are used to selectively connect the local bitlines LBL13-LBL33 to the global bitlines GBL1-GBL3 using row select line SG3.

Referring to FIG. 4H, as only a single bitline select device is used per local bitline, only the voltage of a particular global bitline may be applied to a corresponding local bitline. Therefore, when a first set of local bitlines (e.g., LBL11-LBL31) is biased to the global bitlines GBL1-GBL3, the other local bitlines (e.g., LBL12-LBL32 and LBL13-LBL33) must either also be driven to the same global bitlines GBL1-GBL3 or be floated. In one embodiment, during a memory operation, all local bitlines within the memory array are first biased to an unselected bitline voltage by connecting each of the global bitlines to one or more local bitlines. After the local bitlines are biased to the unselected bitline voltage, then only a first set of local bitlines LBL11-LBL31 are biased to one or more selected bitline voltages via the global bitlines GBL1-GBL3, while the other local bitlines (e.g., LBL12-LBL32 and LBL13-LBL33) are floated. The one or more selected bitline voltages may correspond with, for example, one or more read voltages during a read operation or one or more programming voltages during a programming operation.

Figure 5:
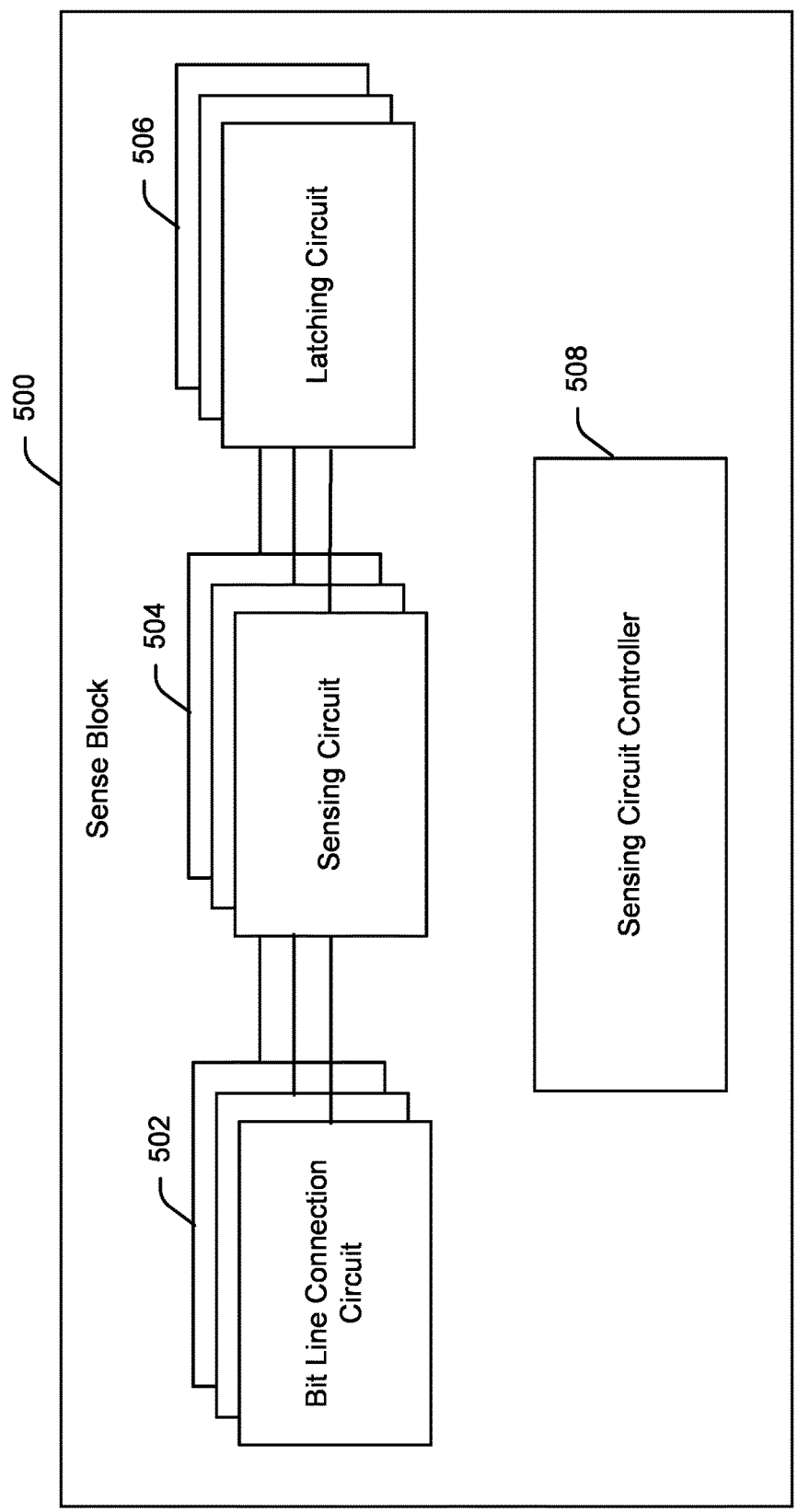
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 150 (FIG. 1). The sense block 500 may include a plurality of sense circuits 504 and a plurality of sets of latching circuits 506. For example, there can be 16 k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g. for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
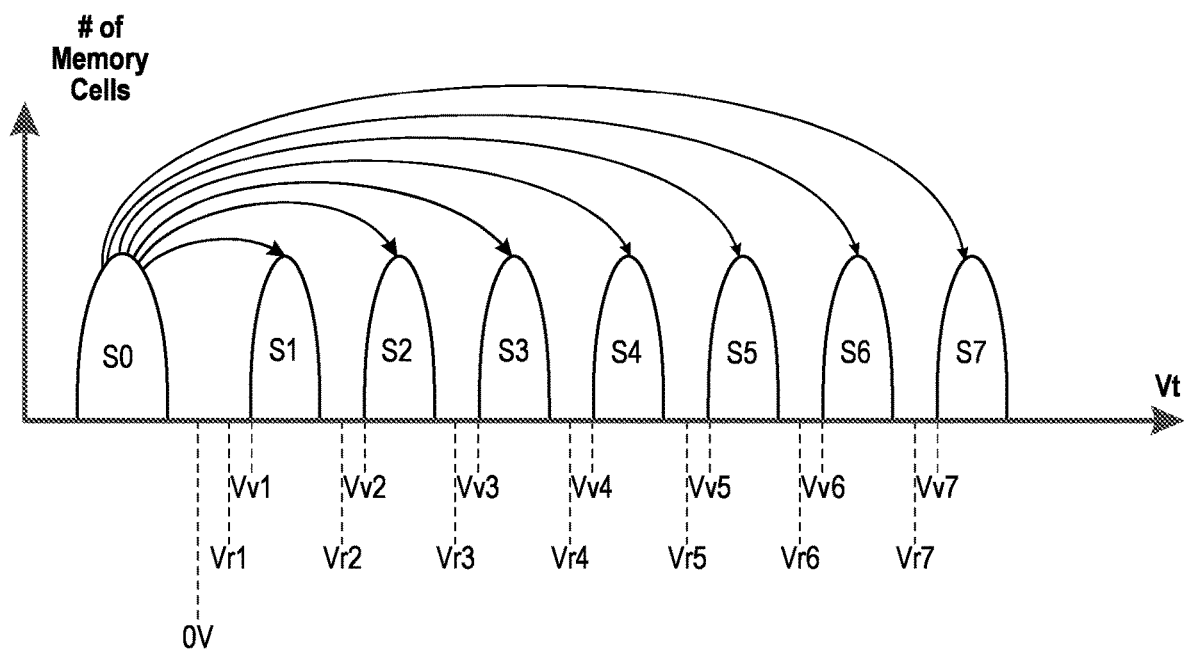
FIG. 6 depicts threshold voltage distributions in a three-bit per cell embodiment, in connection with which, example embodiments of the disclosed technology can be implemented.

The memory systems discussed above can be erased, programmed/written and read. At the end of a successful programming process, the threshold voltages of the memory cells should be within one or more distributions of threshold voltages for programmed memory cells or within a distribution of threshold voltages (Vts) for erased memory cells, as appropriate. FIG. 6 illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6 shows eight threshold voltage distributions, corresponding to eight data states. The first threshold voltage distribution (data state) S0 represents memory cells that are erased (e.g., in a programmable state). The other seven threshold voltage distributions (data states) S1-S7 represent memory cells that are programmed and, therefore, are called programmed states (also referred to herein as inhibit programming or inhibit states). Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (e.g., S0, S1, S2, S3, . . . ) a memory cell is in.

FIG. 6 also shows seven verify reference voltages, Vv1, Vv2, Vv3, Vv4, Vv5, Vv6, and Vv7. When programming memory cells to data state S1, the system will test (or verify) whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the programmable data state S0 directly to any of the programmed data states S1-S7. For example, a population of memory cells to be programmed may first be erased so that all memory cells in the population are in programmable data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

Figure 7A:
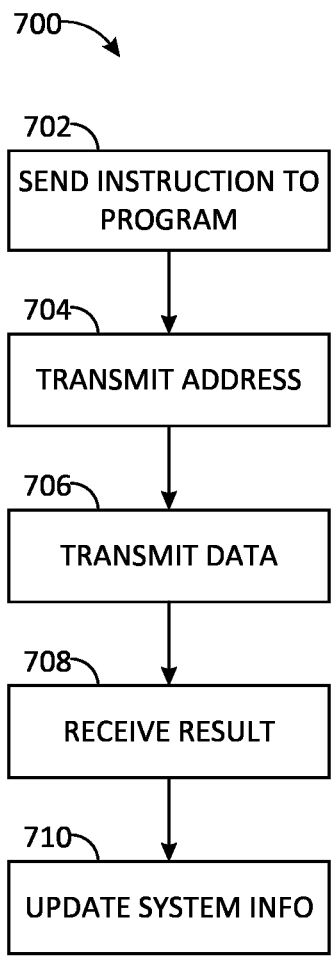
FIG. 7A is a flowchart describing one embodiment of a process for programming/writing, in connection with which, example embodiments of the disclosed technology can be implemented.

FIG. 7A is a flowchart of an example process 700 for programming memory cells. In some embodiments, the process 700 may be performed by controller 122. In other embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory dies 108. In step 708, controller 122 receives a result of the programming from the one or more memory die 108. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/wordlines are open/closed (or partially opened/closed), which blocks/wordlines are bad, etc.

In some embodiments, before step 702, controller 122 would receive host data and an instruction to program from the host, and the controller would run the ECC engine 224 to create code words from the host data, as known in the art. These code words are the data transmitted in step 706. Controller 122 (e.g., writing/reading manager 236) can also scramble the data prior to programming the data in the memory.

Figure 7B:
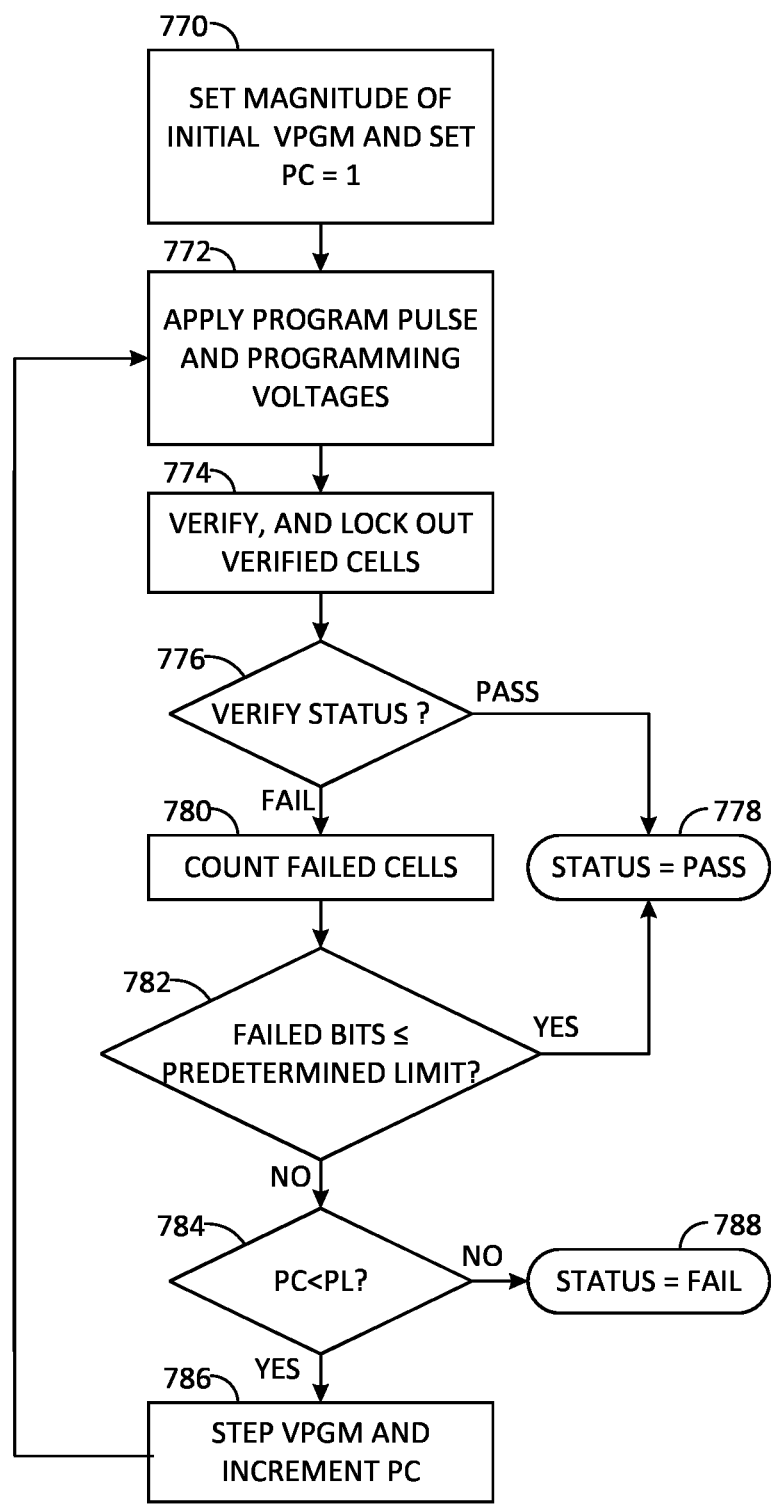
FIG. 7B is a flowchart describing one embodiment of a process for programming/writing data into memory cells connected to a common wordline, in connection with which, example embodiments of the disclosed technology can be implemented.

FIG. 7B is a flowchart of another example process 720 for programming memory cells. In some embodiments, the process 720 is performed by the memory die in response to the steps of FIG. 7A (e.g., in response to the instructions, data and addresses from controller 122). In one example embodiment, the process of FIG. 7B is performed on memory die 108 using the one or more control circuits discussed above (see FIG. 1), at the direction of state machine 112. The process of FIG. 7B can also be used to implement the full sequence programming discussed above. The process of FIG. 7B can also be used to implement each phase of a multi-phase programming process.

Typically, the program voltage applied to the control gates (via a selected wordline) during a program operation is applied as a series of program pulses. Between programming pulses are a set of verify pulses to perform verification. In many implementations, the magnitude of the program pulses is increased with each successive pulse by a predetermined step size. In step 770 of FIG. 7B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected wordline (the wordline selected for programming). In one embodiment, the group of memory cells being programmed concurrently are all connected to the same wordline (the selected wordline). The unselected wordlines receive one or more boosting voltages (e.g., ~7-11 volts) to perform boosting schemes known in the art. If a memory cell should be programmed, then the corresponding bitline is grounded. On the other hand, if the memory cell should remain at its current threshold voltage, then the corresponding bitline is connected to VDDSA to inhibit programming, and are therefore considered in the inhibit state. In yet another case, if the memory cell has a transitory state that is weakly programmed, then the corresponding bitline is applied with an intermediate voltage VQPW. In step 772, the program pulse is concurrently applied to all memory cells connected to the selected wordline so that all of the memory cells connected to the selected wordline are programmed concurrently. That is, they are programmed at the same time or during overlapping times (both of which are considered concurrent). In this manner all of the memory cells connected to the selected wordline will concurrently have their threshold voltage change, unless they have been locked out from programming.

In step 774, the appropriate memory cells are verified using the appropriate set of verify voltage levels to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, then the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, then the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected wordline so that another iteration (steps 772-786) of the programming process of FIG. 7B is performed.

In general, during verify operations and read operations, the selected wordline is connected to a voltage (one example of a reference signal), a level of which is specified for each read operation (e.g., see read reference voltages Vr1, Vr2, Vr3, Vr4, Vr5, Vr6, and Vr7, of FIG. 6) or verify operation (e.g., see verify reference voltages Vv1, Vv2, Vv3, Vv4, Vv5, Vv6, and Vv7 of FIG. 6) in order to determine whether a threshold voltage of the concerned memory cell has reached such level. After applying the wordline voltage, the conduction current of the memory cell is measured to determine whether the memory cell turned on (conducted current) in response to the voltage applied to the wordline. If the conduction current is measured to be greater than a certain value, then it is assumed that the memory cell turned on and the voltage applied to the wordline is greater than the threshold voltage of the memory cell. If the conduction current is not measured to be greater than the certain value, then it is assumed that the memory cell did not turn on and the voltage applied to the wordline is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bitline. The voltage on the bitline is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), wordline units, blocks, jumbo blocks, or other units.

Figure 7C:
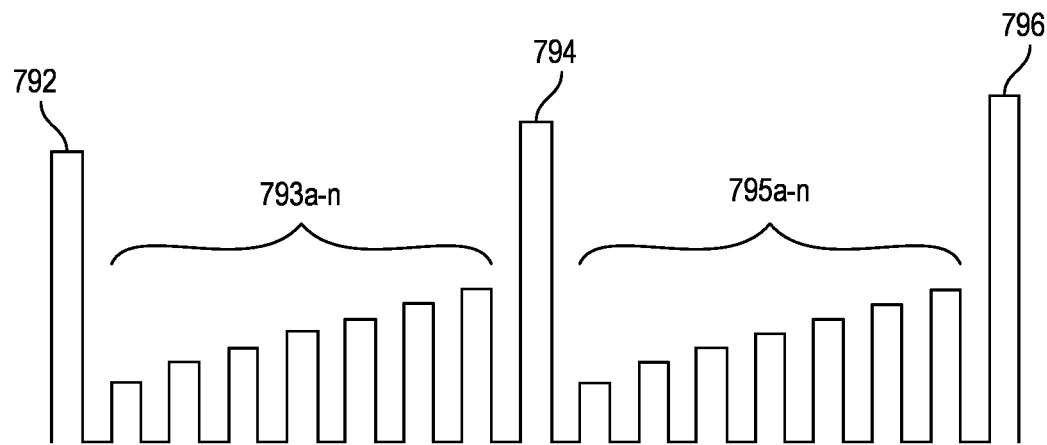
FIG. 7C depicts a wordline voltage during programming/writing and verify operations, in connection with which, example embodiments of the disclosed technology can be implemented.

Step 772 of FIG. 7B includes applying a program voltage pulse on the selected wordline. Step 774 of FIG. 7B includes verification, which in some embodiments comprises applying the verify reference voltages on the selected wordline. As steps 772 and 774 are part of an iterative loop, the program voltage is applied as a series of voltage pulses that step up in magnitude. Between voltage pulses, verify voltage levels are applied. This is depicted in FIG. 7C, which shows program voltage pulses 792, 794 and 796, applied during three successive iterations of step 772. Between program voltage pulses 792, 794 and 796, the system tests the memory cells to determine whether threshold voltages of the memory cells are greater than the respective verify voltages by applying the references voltages as verify pulses 793a-n, 795a-n, etc.

An important aspect in the performance of non-volatile memories is programming speed. The goal in programming a memory is to write the data quickly, but with precision. In a binary memory, it is only necessary to use one threshold voltage level to distinguish between two memory states. When a memory cell is programmed, the system test whether the memory cells have a threshold above the threshold voltage level of a respective data state, as described above in connection with FIG. 6. If the threshold is above the threshold voltage, the memory cell is considered to be in a "programmed" or inhibit program state, otherwise it remains in an "unprogrammed" or programmable state. Alternatively, for a given gate voltage, a less or weakly programmed cell will have more conduction current. Thus, when a threshold voltage is applied to the gate of a memory cell, there will be corresponding threshold conduction current. If a cell has conduction current higher than the threshold conduction current, it is considered to be in the unprogrammed state; otherwise it is in the programmed state.

In a multi-state memory, the situation is more complicated since each intermediate data state (e.g., states S1-S6 in FIG. 6) is demarcated between two threshold voltage levels, one for a given intermediate state and one for a neighboring state. For example, the threshold voltage for state S1 of FIG. 6 is Vv1 and the threshold voltage for state S2 is Vv2. State S1 is therefore demarcated between these two threshold voltages. When programming to an intermediate state, the cell must be programmed with a threshold voltage in between the two threshold voltage levels. So the threshold voltage must lie above a first threshold voltage level (e.g., Vv1 for state S1), but not too high above or its will overshoot the second threshold voltage level (e.g., Vv2 for S2). Thus, there is a need for accurate programming and sense operations to facilitate the same. In terms of programming a population of memory cells, accurate programming amounts to having the population of the cells clusters tightly between the threshold voltage levels (see FIG. 6). Any inaccuracies in programming would lead to the distribution of a given state erroneously spreading beyond the distribution of its threshold voltage level, and possibly into the distribution of a threshold voltage level of a neighboring state. Even if the threshold of a given state is within its distribution but spread out to the limits, the state will be prone to error due to program disturb or other environmental effects. This problem is aggravated as the number of states increases, or when the available threshold window is reduced, or both.

As introduced above, one example solution to create narrower or tighter Vth distributions is to implement a quick pass write (QPW) technique. The QPW technique involves changing a bit-line level for memory cells that are close to a verify voltage level VH so that the memory cells appear as if a programming pulse step is reduced, as described above. Thus, when a faster-programming memory cell is within a threshold range of the programmed state, the programming pulse step voltage is adjusted to slow the rate at which the memory cell is programmed. However, this slows the programming of all bits that remain to be programmed, thus increasing the total programming time In some implementations, verification that the threshold voltage of the memory cells are greater than respective verify voltages includes verifying the reference voltage applied during a single verify pulse (e.g., one of 793a-n) is greater than the first verify voltage level VL and the second verify voltage level VH. That is, within on verify pulse, sense operations (e.g., steps 774-782) is performed twice. First for the first verify voltage level VL and a second for the second verify voltage level VH.

For example, with reference to FIG. 7B, at step 774 the appropriate memory cells are verified first using the lower verify voltages VL to perform a first sense (or verify) operation and then the memory cells are verified again using the higher verify voltages VH to perform a second verify (or sense) operation. At step 776, if all the memory cells have reached their target threshold voltages when verified using both the lower and higher verify voltages VL and VH, the memory cell is considered to be in the inhibit state and a status of PASS is reported to step 778. If, in step 776, it is determined that not all of the memory cells have reached their target threshold voltages using both the lower and higher verify voltages VL and VH, then the memory cells are considered in the programmable state and a status of FAIL is reported to step 778. Then, the programming process continues to step 780. If, however, if the memory cells have reached their target threshold voltage when verified using the lower verify voltage VL but have not reached their target threshold voltage when verified using the higher verify voltage VH, then the memory cells are considered in the weakly programed state.

The sensing operations of the memory cells described in connection with FIGS. 7A-7C can be performed by sense amplifier circuits that can be part of the sense blocks 150 including SB1, SB2, . . . , SBp of FIG. 1. The embodiments of the disclosed technology provide for sense amplifier circuits and, more specifically, at sense amplifier architectures that can improve memory performance. As the amount of data that non-volatile memories can store increases, the performance requirements of the memory devices also increase. To meet market demand, there is an on-going effort to improve performance by reducing read times and program times. In typical sense amplifier designs, a major component of sensing times, both for data read and program or erase verify, are wordline ramp up times, bitline ramp up times, and settling times, along with the verification times described in connection with FIGS. 6-7C.

Figure 8:
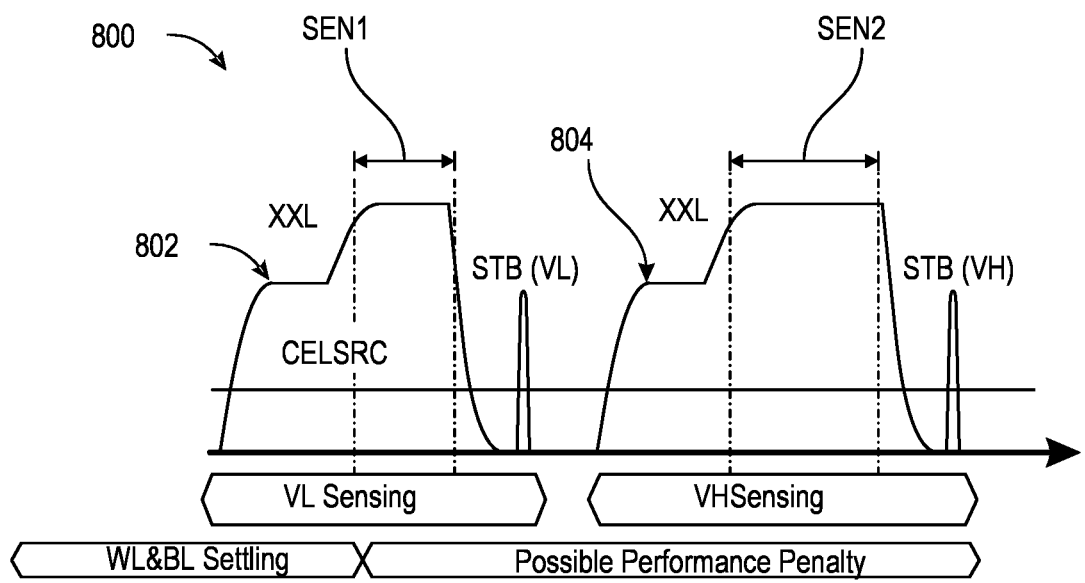
FIG. 8 illustrates a graph of a waveform of a two-pass programming verification.

For example, FIG. 8 illustrates a graph of a waveform 800 of a sense operation, for example, during on verify pulse as described above. The waveform 800 includes a first waveform 802 of voltage levels applied to during a first sense operation included in a verify pulse and a second waveform 804 during a second sense operation of the verify pulse. In typical sense amplifier designs, during the first sense operation, in which the threshold voltage of the memory cells is verified at the verify voltage level VL, the voltage at the wordline is held at the verify voltage level VH as the bitline ramps up and settles. Once settled and an XXL transistor is brought high (also referred to as an XXL switch, which is turned on), a sensing capacitor can be discharged through the memory cell. After a first determined amount of time, the XXL transistor is brought low and a first voltage level corresponding to a first verification result is retained in the sensing capacitor. The first voltage level at the sensing capacitor can then be sampled by a first strobe pulse STB (VL) and the first voltage level verified based on the verify voltage level VL. Subsequently, the XXL transistor is brought high again and a sensing capacitor (either the same sensing capacitor or a different one) is discharged through the memory cell. cell. After a second determined amount of time, the XXL transistor is brought low and a second voltage level corresponding to a second verification result is retained in the sensing capacitor. The second voltage level can then be sampled by a second strobe pulse STB(VH) and the second voltage level verified based the verify voltage level VH. The first determined amount of time may be less than the second determined amount of time.

Due to the VH to VL distance (e.g., time distance between VH and VL verification), there is a performance penalty in the delayed VH verification. This delay translates to delay in programming memory cells that are verified in the programmable state. That is, a technical shortcoming of existing solutions is that each programming sequence requires two verification passes.

Accordingly, embodiments of the technology disclosed herein provide for sense amplifier architectures and methods of operating the same that lead to reduced sensing times, specifically with respect to the verification using two verify voltage levels (e.g., VH and VL). More particularly, as detailed below, embodiments herein utilize a single verification operation that is able to simultaneously discharge two capacitors. Discharge of each capacitor provides two voltage levels, one at each capacitor, which can be separately verified using two verify voltage levels (e.g., VH and VL).

Figure 9:
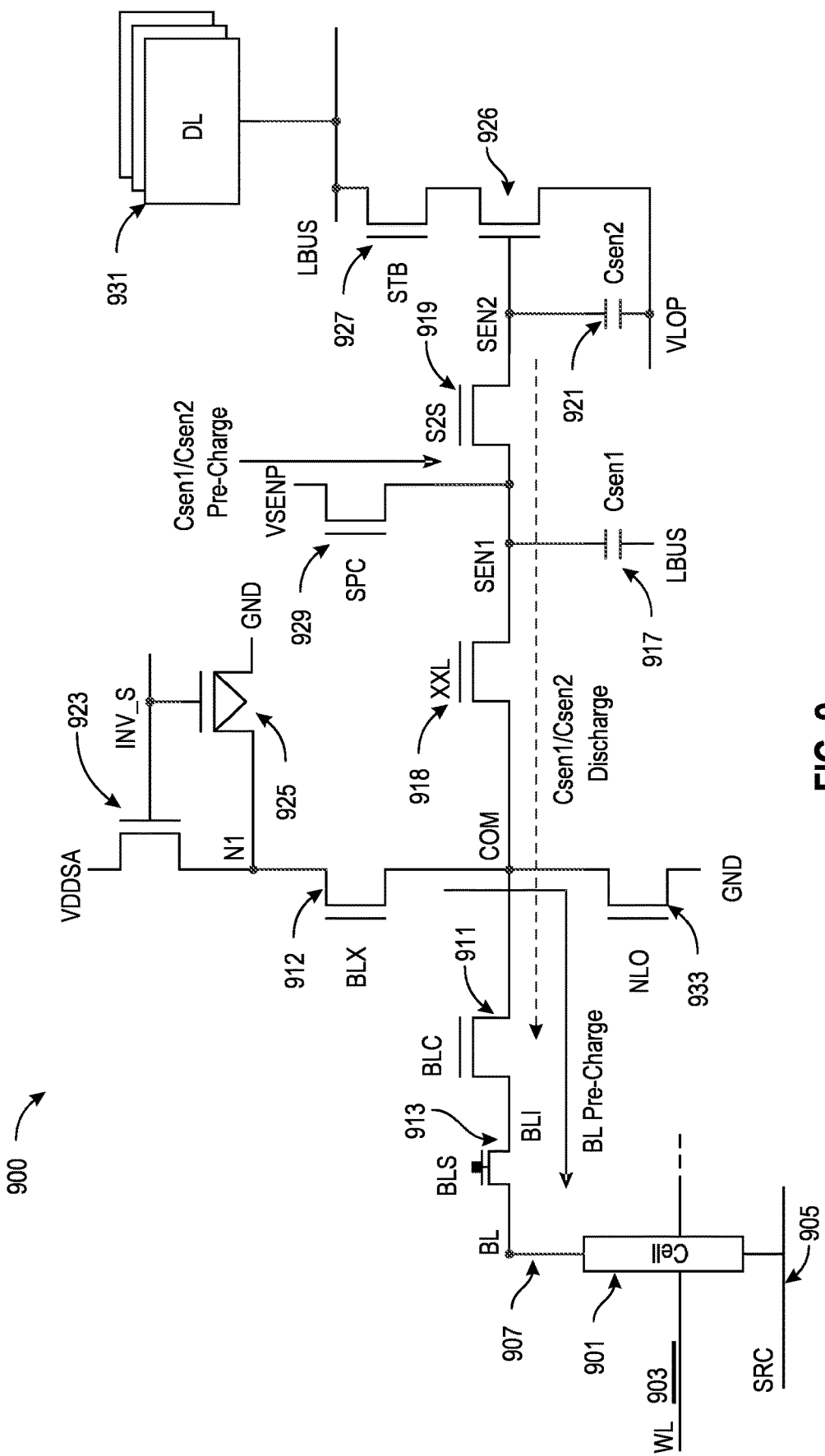
FIG. 9 illustrates an example of a sense amplifier architecture connected to a selected memory cell, in accordance with embodiments of the disclosed technology.

FIG. 9 illustrates an example of a sense amplifier architecture (or circuit) 900 connected to a selected memory cell 901, in accordance with embodiments of the disclosed technology. FIG. 9 presents a simplified representation of a sense amplifier design that operates by simultaneously discharging two sensing node or capacitors through a selected memory cell, and then using the resultant voltage on one sensing node to set the gate voltage on a sensing transistor through which one of the sensing nodes connected to a data latch is discharged to latch a first sensing result. After which, prior bias conditions of the sensing nodes or capacitors are recovered, and an intermediate transistor between the sensing nodes or capacitors turned on to set the gate voltage of the sensing transistor set again through which the sensing node connected to the data latch is discharged to latch a second sensing result. Sense amplifier architecture 900 may be representative of an example of sense blocks 150 of FIG. 1 and/or sense block 500.

The selected memory cell 901 is connected along a wordline WL 903 and bitline BL 907, which is in turn connected to a bitline select switch BLS transistor 913 on one end and a source line SRC 905 on the other end. The selected memory cell 901 can be from one of the various technologies described above, for example, in connection with FIGS. 1-5. In the case of a NAND memory structure or other architectures where other control lines (such as for the select gates or the non-selected memory cells of a NAND string) require biasing for the sensing of a selected memory cell, these additional control lines are not represented in FIG. 9, but would be biased as needed for the sensing operations described in the following discussions. The bitline select switch 913 allows for one or more bitlines to be selectively connected to the internal bitline node BLI of the sense amplifier. (In the following, devices such as the transistor BLS transistor 913 will frequently be referred to by the same name as the control signal applied to the device's gate). The BLS transistor 913 to the BL 907 may be representative, for example, of a bitline connection circuit 502 of FIG. 5.

In the sense amplifier circuit of FIG. 9, the internal bitline node BLI is connected through the bitline clamp BLC transistor 911 to a common node COM, which is in turn connected through the XXL transistor 918 to a first sensing node SEN1. A first sensing capacitor Csen1 917 is connected to the SEN1 node on its top plate (as illustrated in FIG. 9) and to a latch bus LBUS node on its bottom plate. The SEN1 node is connected to a second sensing node SEN2 through a sensing to sensing (S2S) transistor 919. A second sensing capacitor Csen2 921 is connected to the SEN2 node at its top plate and a level VLOP (e.g., CLKSA or clock of the sensing amplifier) at its bottom plate. The SEN2 node is connected to a control gate of a SEN2 transistor 926, which is in turn connected to the level VLOP and to the LBUS through strobe (STB) transistor 927. One or more data latches (DL) 931 are connected to the LBUS. In various embodiments, the sense amplifier 900 will be connected to multiple data latches, such as in the case of multi-level memory cell operations. A typically implementation of a sense amplifier circuit 900 will have a number of other elements related to sensing and other functions the sense amplifier may perform (such as biasing a bitline to a program enable or program inhibit level during a program operation), but these are not shown here to simply the figure and discussion. The STB transistor 927, LBUS node, and DLs 931 may be representative, for example, of latching circuit 506 of FIG. 5.

The COM node is connectable to the level VDD for the sense amplifier (VDDSA) though the BLX transistor 912 and to the level ground (GND) through NLO transistor 933. The COM node can be charged from a level VDDSA by way of BLX transistor 912, which is in turn connectable, at node N1, to VDDSA through transistor 923 and to ground (GND) through a p-channel metal-oxide semiconductor (PMOS) 925. The control gates of the PMOS 925 and transistor 923 are connected to a logically inversed control signal INV_S. Thus, when INV_S is high the transistor 923 will be on and the PMOS 925 will be off, and when INV_S is low the transistor 923 will be off and the PMOS 925 will be on. The transistor 923 and PMOS 925 can be used to set the bitline BL 907 to a program inhibit or a program enable level during a programming operation, for example.

The SEN1 node can be charged from a level VSENP by way of SPC transistor 929. The values of VDDSA and VSENP will depend upon the particulars of the implementation and may be different or the same, where these will be high supply voltage levels for the sense amplifier and typically with a value on the order of a few volts. In an illustrative example, level VDDSA may be approximately 2.2V and the level VSENP may be 2V.

The various transistors of FIG. 9 may be implemented as switches. In the illustrative example of FIG. 9, the transistors may be implemented as n-channel metal-oxide semiconductors (NMOS) devices, for example, the BLS transistor 913, BLC transistor 911, the BLX transistor 912, the NLO transistor 933, the XXL transistor 918, the SPC transistor 929, the S2S transistor 919, the SEN2 transistor 926, and the STB transistor 927 may each be implemented as an NMOS device. Alternatively, one or more of the transistors may be implemented as a PMOS devices, for example, where the polarity of the current is reversed.

Figure 10:
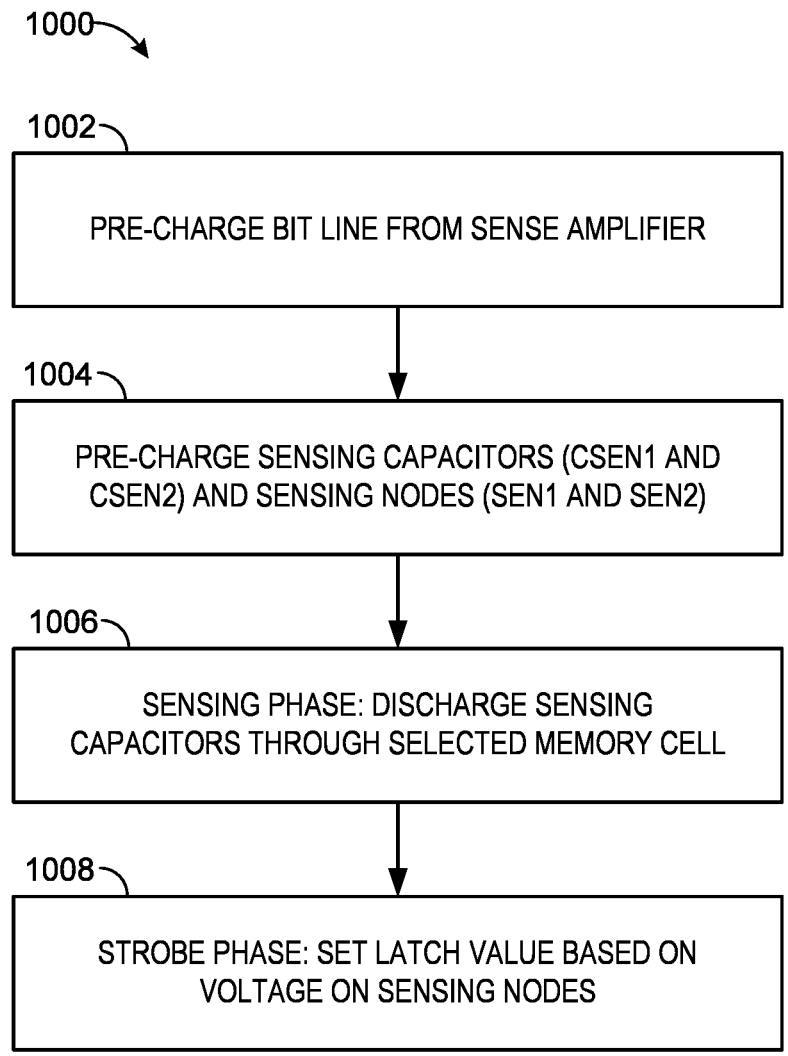
FIG. 10 is flowchart illustrating an example sensing operation of the sense amplifier architecture of FIG. 9.

FIG. 10 is flowchart illustrating an embodiment for operation of the sense amplifier circuit of FIG. 9 during a program-verify operation 1000. Program verify operation 1000 is an example of step 774 of FIG. 7B, for example, where a selected memory cell is verified using sense amplifier architecture 900 and the appropriate set of verify voltage levels. The operation 1000 may be performed by controller 122, and more particularly, by sensing circuit controller 508 of FIG. 5. For example, sensing circuit controller 508 can send control signals to the components of sense amplifier architecture 900 to perform the operation 1000.

At step 1202, the bitline 907 of a selected memory cell 901 is pre-charged by way of the internal bitline node BLI.

The node BLI is pre-charged to VBLC-Vth voltage through the VDDSA-BLX-BLC-BLI path as illustrated by the correspondingly labelled solid arrow in FIG. 9, where VBLC is the voltage applied to the gate of BLC 911 and Vth in this instance is threshold voltage of BLC transistor 911. The gate of BLX transistor 912 will receive a voltage VBLX that is higher than VBLC voltage to keep the BLC transistor 911 in saturation. The VBLX voltage will define the COM node's voltage, which will be VBLX-Vth, where in this instance Vth is threshold voltage of BLX transistor 912.

In step 1204 the sensing capacitors Csen1 917 and Csen2 921 and nodes SEN1 and SEN2 are pre-charged. Csen1 917 and Csen2 921 are pre-charged to VSENP-Vth voltage through the V-SPC-Csen1/Csen2 path as illustrated by the correspondingly labelled solid arrow in FIG. 9, where VSENP is the voltage applied to the drain of SPC transistor 1129 and Vth in this instance is threshold voltage of SPC transistor 1129. In several implementations, gate levels of the SPC transistor 9129 and S2S transistor 919 are high enough such that VSENP passes directly. The VSENP level can be the high voltage level for sense amplifier, so that Csen1 917 and Csen2 921 can be charged up to a few volts, for example, with the specific value depending on the implementation. The gate of SPC transistor 929 will receive a voltage VSPC that is higher than VS2S voltage (e.g., the voltage applied to the gate of S2S transistor 919) to keep the SPC transistor 929 in saturation. The VSPC voltage will define the SEN1 and SEN2 nodes' voltage, which will be VSPC-Vth, where in this instance Vth is threshold voltage of SPC transistor 929. Steps 1202 and 1204 can be performed in either order or concurrently, but are before the following step 1206.

As part of the verification process, the selected memory cell 901 is biased as described above by setting the voltage on the wordline WL 903 to a verify voltage levels of a respective data state (e.g., one of Vv1-Vv7 of data states S1-S7)), as well as biasing the other elements (e.g., non-selected wordlines, select gates, source lines) as needed for the particular memory technology being used. For the example of NAND memory, a selected memory cell 901 will have a high resistance (e.g., low conductivity) to low resistance (e.g., high conductivity) based on the memory cell's state (e.g., programmable, weakly programed, or program inhibit) for particular verify voltage relative to the data state of the memory cell. In some embodiments, the verify reference level may be set at the same level as the verify voltage level VH for the respective data state.

The sensing phase is performed at step 1206. Subsequent to the pre-charge operations of steps 1202 and 1204 in which BL 907, Csen1 917, and Csen2 921 are pre-charged to their expected values, the bottom plate of the Csen2 921 and source of the SEN2 transistor 926 can be raised to the VLOP level to increase the SEN1 and SEN2 nodes' voltage levels. For example, when the memory cell has a large on-current, the voltage level at the SEN1 and/or SEN2 nodes can be discharged down only to the COM node's voltage (e.g., CELSRC voltage level plus some overhead), which may be above SEN2 transistor's 926 voltage. This may be a problem because the SEN2 transistor 926 is on regardless of the state of the memory cell state. Thus, to resolve this issue, LBUS and VLOP are set to high voltage subsequent to the pre-charge operations of steps 1002 and 1004 (e.g., prior to $t_1$ of FIG. 12 below). Additionally, setting the LBUS and VLOP to high voltage raises the voltages at the SEN1 and SEN2 nodes, which are connected with S2S transistor 919. With S2S transistor 919 pre-charged to the VS2S-Vth voltage, Csen1 919 and CSen2 921 are discharged through the SEN1/SEN2-XXL-BLC-BL path by bringing the XXL transistor 918 and BLC transistor 911 high (e.g., turned on). Based on the selected memory cell's state, the Csen1 917, and Csen2 921 will either discharge or not discharge, as illustrated by the correspondingly labelled broken arrow of FIG. 9.

The sensing phase of step 1206 continues to discharge the SEN2 node voltage (in the case where the selected memory cell 901 is in either the programmable or weakly programed state) until the threshold voltage of the S2S transistor 919 is reached. Simultaneously, the SEN1 node voltage discharges (in the case where the selected memory cell 901 is in either the programmable or weakly programed state) until the threshold voltage of the XXL transistor 98 is reached. If the selected memory cell 901 is in a high resistance state, Csen1 919 and Csen2 921 will see little or no discharge and SEN1 and SEN2 nodes will stay high, for example, in the case where the selected memory cell 901 is in the inhibit program state.

In a strobe operation at step 1208, the gate voltage of STB transistor 927 goes high, for example by a control signal from the sensing circuit controller 508, and SEN2 transistor 926 will either turn ON or turn OFF based on the voltage level on Csen2 921/SEN2 node voltage that sets the gate of the SEN2 transistor 926. Based on the state of SEN2 transistor 926, the node LBUS will either have a high value for its voltage or be discharged through STB transistor 927 and SEN2 transistor 926 and have a low value. The result can then be latched into one of data latches 931 and subsequently sent out on the data bus.

Figure 11:
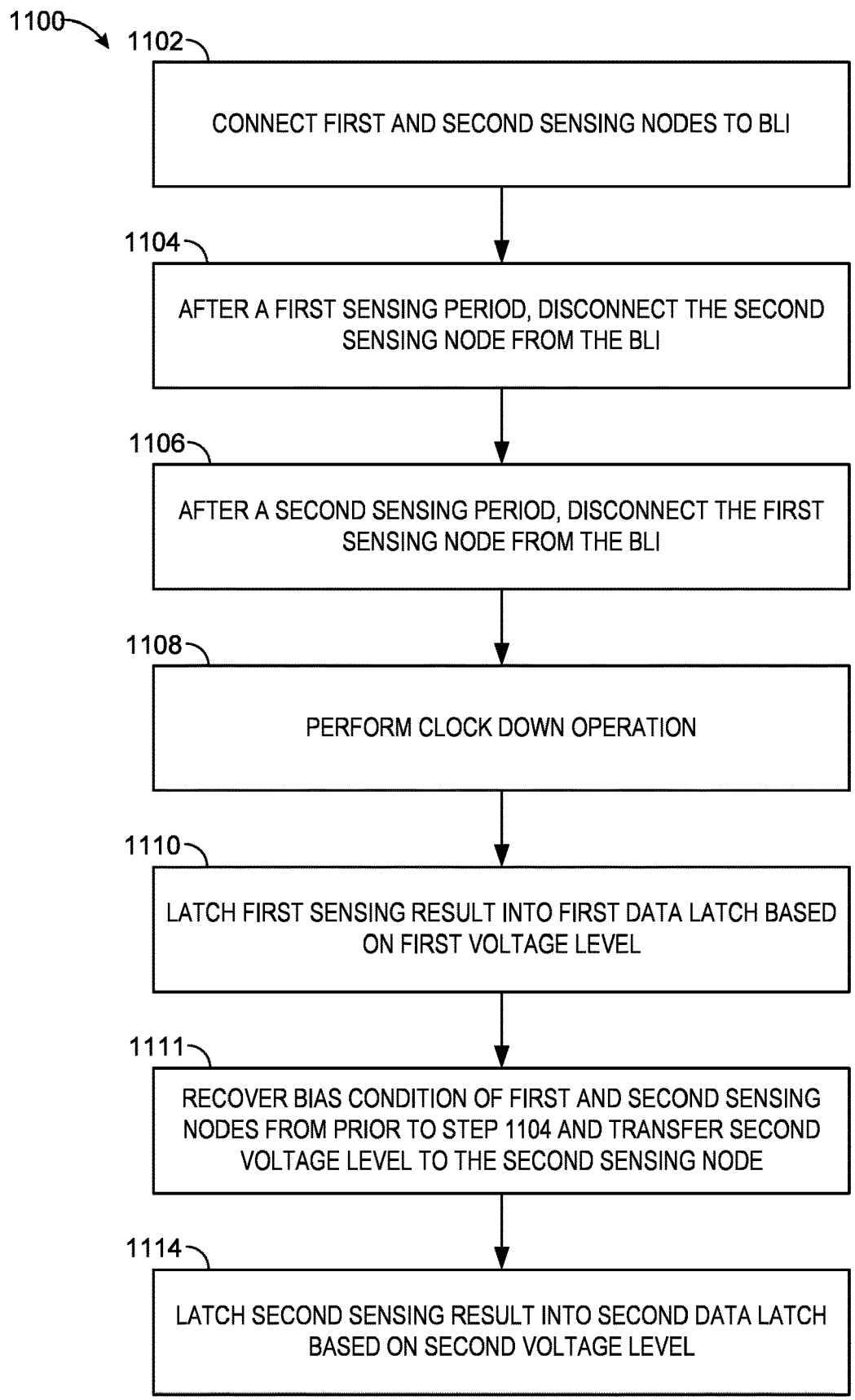
FIG. 11 is flowchart illustrating an example of a sensing phase and strobe phase of the example sensing operation of FIG. 10.
Figure 12:
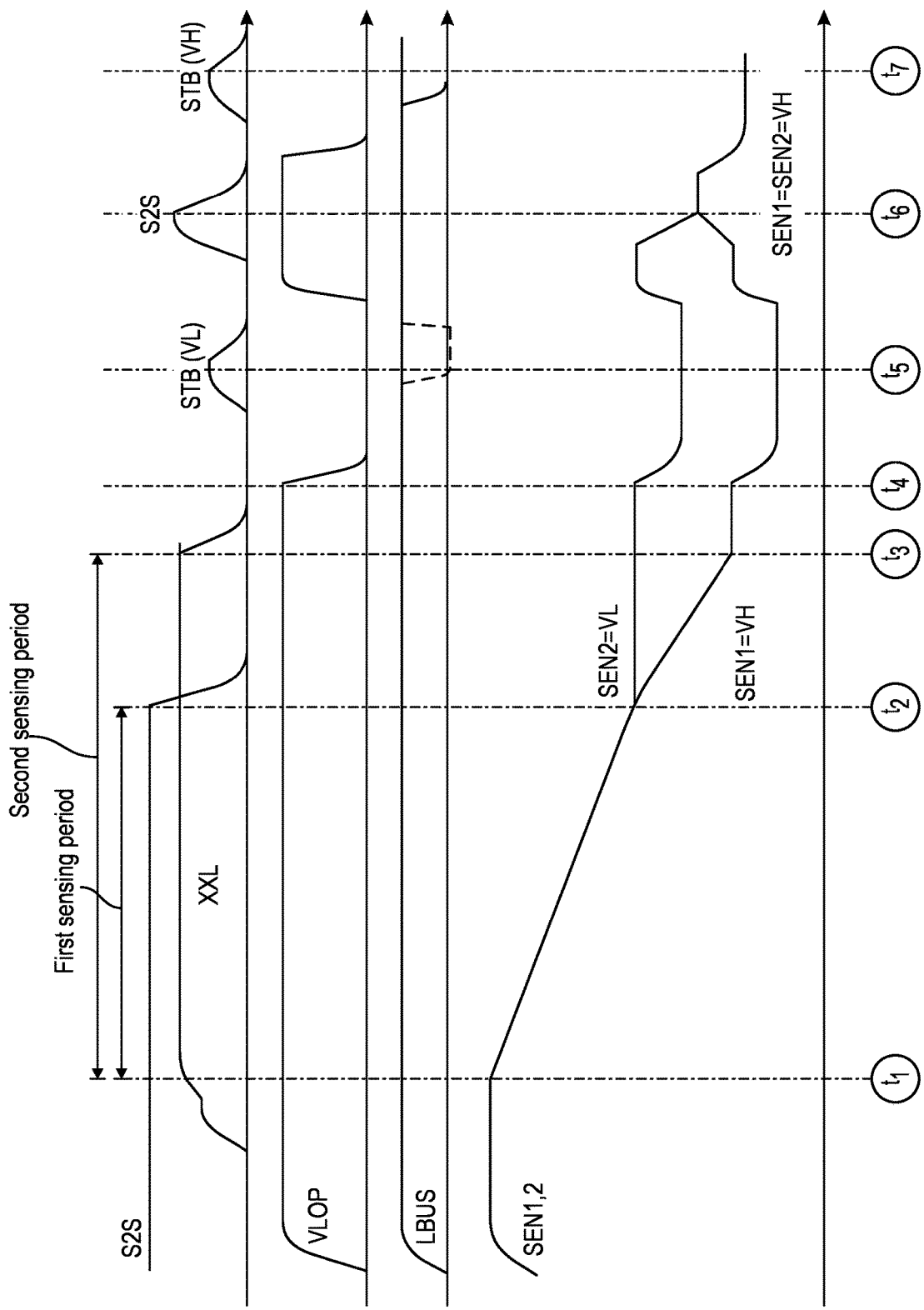
FIG. 12 is a set of waveforms illustrating timings involved the sensing phase and strobe phase of FIG. 11.

FIG. 11 is flowchart illustrating an embodiment for operation 1100 of the sensing phase 1006 and strobe phase 1008 of during the sensing operation of 1000. FIG. 12 is a set of waveforms illustrating some of the timings involved in the operation 1100. The waveforms shown in FIG. 12 are provided as voltages plotted as a function of time.

As introduced above, during the pre-charge operation steps 1202 and 1204, S2S transistor 929 is brought high (e.g., turned on), which pre-charges the Csen1 917 and Csen2 921 to the VS2S-Vth voltage. Furthermore, subsequent to the pre-charge operations of steps 1202 and 1204, the bottom plate of the Csen2 921 and source of the transistor 926 can be raised to the VLOP level to increase the SEN1 and SEN2 nodes' voltage levels and turns on the LBUS, raises the voltage levels at the SEN1 and SEN2 nodes.

In step 1102 of FIG. 11 and time $t_1$ of FIG. 12, as part of the sensing phase performed at step 1206, the gate of the XXL transistor 918 is brought high to turn it on. This connects the SEN1 and SEN2 nodes to the selected memory cell 901 through the SEN1/SEN2-XXL-BLC-BL path shown in FIG. 9. For example, a voltage VXXL is applied to the gate of XXL transistor 918, for example, a control signal from a sensing control circuit (e.g., sensing control circuit 508) is used to set the gate of the XXL transistor 918 and reduce the voltage required at the source to reach the threshold voltage. As introduced above, based on the selected memory cell's state, the Csen1 917 and Csen2 921 will either discharge or not discharge.

At step 1104 of FIG. 11 and time $t_2$ of FIG. 12, at the end of a first sensing period, the gate of the S2S transistor 919 is brought down (e.g., turned off), which disconnects the SEN2 node from the memory cell 901 and Csen2 921 stops discharging (in the case where the selected memory cell 901 is in the programmable or weakly programed state). For example, during the first sensing period, the SEN1 and SEN2 nodes' voltages (in the case where the selected memory cell 901 is in the programmable or weakly programed state) discharge simultaneously until the voltage level at the Csen2 921/SEN2 node reaches the threshold voltage of the S2S transistor 919. The SEN2 node is cut off from the memory cell 901 and retains a first voltage level. If the selected memory cell 901 is in a high resistance state, Csen1 919 and Csen2 921 will see little or no discharge and SEN1 and SEN2 nodes will stay high.

At step 1106 of FIG. 11 and time $t_3$ of FIG. 12, at the end of a second sensing period, the XXL transistor 918 is brought down, which disconnects the SEN1 node from the memory cell and Csen1 917 stops discharging (in the case where the selected memory cell 901 is in the programmable state). For example, during the second sensing period, the SEN1 node's voltage (in the case where the selected memory cell 901 is in the programmable state) discharges until SEN1 node reaches the threshold voltage of the XXL transistor 918. The SEN1 node is then cut off from the memory cell 901 and retains a second voltage level. If the selected memory cell 901 is in a high resistance state, Csen1 919 will see little or no discharge during the second sensing period and SEN1 node will stay high.

Figure 13:
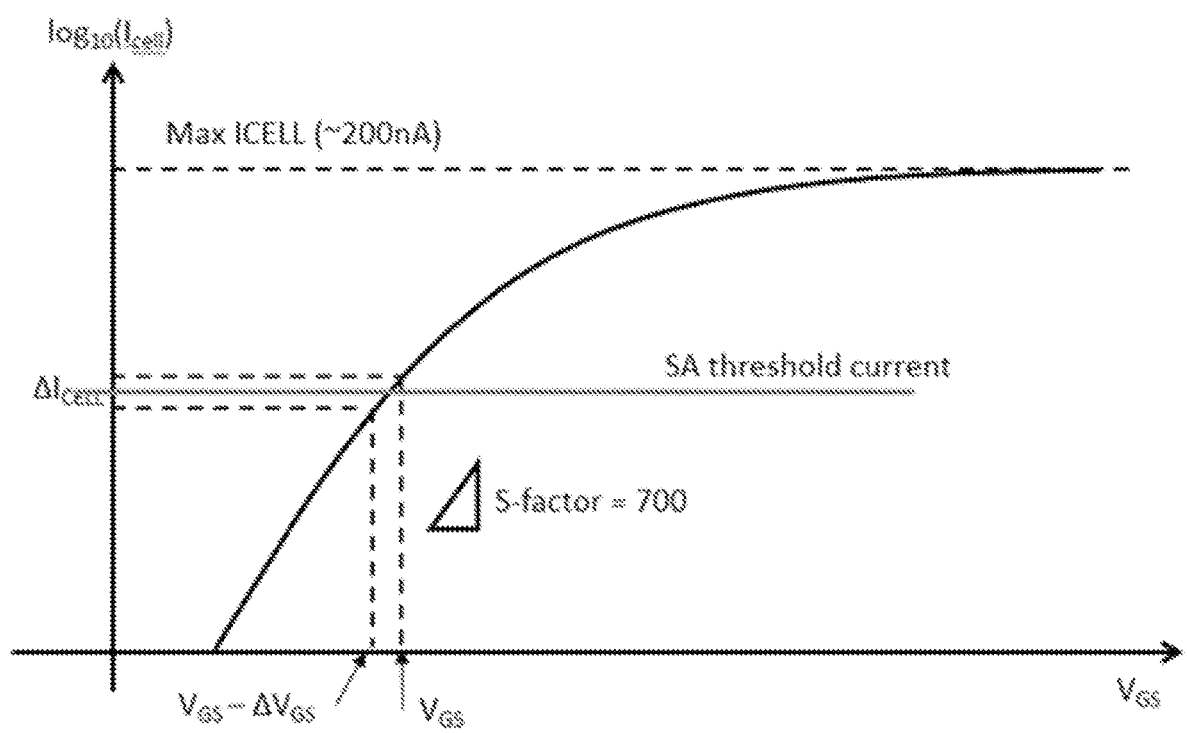
FIG. 13 illustrates an example I-V curve of a memory cell 901 according to an example implementation.

In various embodiments, the voltage at the WL 903 may be held at the verify voltage level VH throughout operation 1100, and, in some cases, throughout operation 1000. In various embodiments, the sense amplifier 900 senses whether the memory cell passes verify voltage level VL may by using a first sense pulse width of the first sensing period that is shorter than a second sense pulse width of the second sensing period. The shorter first sensing period causes the threshold current of the sense amplifier to be smaller, which is equivalent to reducing the threshold voltage of the memory cell 901 according to the I-V curve of the memory cell. FIG. 13 illustrates an example I-V curve of the memory cell 901 according to an example implementation of a memory cell. FIG. 13 illustrates a log 10 of the current applied to the memory cell plotted as a function of the threshold voltage (VGS) of the memory cell.

Returning to FIGS. 11 and 12, in a clock down operation at step 1108 of FIG. 11 and time $t_4$ of FIG. 12, the VLOP level at the bottom plate of the Csen2 921 and SEN2 transistor 926 is brought down, which brings down the voltage level retained in the SEN2 node. Whether SEN2 node is high or low depends on the SEN2 transistor 926. However, the threshold voltage of the SEN2 transistor 926 is such that the voltage level at the SEN2 node, even for highly conductive memory cells (e.g., memory cells in the programmable state), may not be able to turn off the SEN2 transistor 926. That is, the voltage level at the SEN2 node may not be high enough so as to reach the threshold voltage of the SEN2 transistor 926 that would cause the SEN2 transistor 926 to turn off. The clock down operation at step 1108 is a mechanism to shift the voltage level retained in the SEN2 node down to a level normalized with the threshold voltage of the SEN2 transistor 926. By normalizing with respect to the threshold voltage of the SEN2 transistor 926, a memory cell 901 in a highly conductive state can discharge the SEN2 node to a voltage level that can turn off the SEN2 transistor and memory cell 901 in a low conductivity state can turn the SEN2 transistor 926 on. That is, in the case where the selected memory cell 901 is in the programmable state, the clock down operation brings the first voltage level retained in the SEN2 node down to or below the threshold voltage of the SEN2 transistor 926.

At step 1110 of FIG. 11 and time $t_5$ of FIG. 12, a first sensing result is latched into a first data latch of data latches 931. For example, as part of a first strobe operation 1208, the gate voltage of STB transistor 927 is brought high and, based on the first voltage level on Csen2 921/SEN2 node, SEN2 transistor 926 will either turn ON or turn OFF. Based on the state of SEN2 transistor 926, the node LBUS will either have a high value for its voltage (e.g., in the case that SEN2 transistor 926 is turned OFF) or be discharged through STB transistor 927 and SEN2 transistor 926 and have a low value (e.g., in the case that SEN2 transistor 926 is turned ON). The high or low level on the LBUS is latched into a first data latch 931 and is indicative of whether the first voltage level satisfies the verify voltage level VL.

For example, in the case the memory cell 901 is in a highly conductive state such that Csen2 921 is discharged (e.g., in a programmable state or weakly programed state), the first voltage level retained in the SEN2 node sets the gate of the SEN2 transistor 926 such that the SEN2 transistor 926 will turn OFF. That is, for example, the first voltage level is at or below the threshold voltage of the SEN2 transistor 926. Based on turning the SEN2 transistor 926 off, the LBUS will have a high level, which is latched into a first data latch of the data latches 931 as a first sensing result. The high level on the LBUS is indicates that the first voltage level is below the verify voltage level VL.

Alternatively, in the case here Csen2 921 saw little or no discharge because the selected memory cell 901 is in a high resistance state (e.g., an inhibit state), the SEN2 transistor 926 will turn ON and the LBUS will discharge through the STB transistor 927 and SEN2 transistor 926. The discharge of the LBUS results in a low level (shown as the dotted line in on the LBUS waveform of FIG. 12), which is latched into the first data latch of the data latches 931 as the first sensing result. The low level on the LBUS indicates that the first voltage level is above the verify voltage level VL.

In either case, at step 1112 of FIG. 11 and time $t_6$ of FIG. 12, the bias conditions of the SEN1 and SEN2 node from prior to step 1104 and after step 1102 are recovered. That is, for example, a clock up operation is performed to raise to the VLOP level and raise the LBUS (in the event that the LBUS had a low level at step 1110). The clock up operation is used, because in the illustrative embodiment, the voltage levels discussed are analog voltages and to accurately transfer analog voltages between nodes, without constant errors, the bias conditions applied on the circuit during transfer of the voltage level must be the same as the bias conditions present when the voltage levels were retained (e.g., just prior to step 1104). Once the bias conditions are recovered, the S2S transistor 919 is brought high while the XXL transistor 918 is kept low, which transfers the second voltage level retained on the SEN1 node to the SEN2 node.

At step 1114 of FIG. 11 and time $t_7$ of FIG. 12, a second sensing result is latched into a second data latch of data latches 931. For example, as part of a second strobe operation 1208, the gate voltage of STB transistor 927 is brought high and, based on the second voltage level transferred to Csen2 921/SEN2 node voltage, SEN2 transistor 926 will either turn ON or turn OFF. Based on the state of SEN2 transistor 926, the node LBUS will either have a high value for its voltage or have a low value. Prior to latching the second sensing result in the second data latch at $t_7$, a second clock down operation is performed, as shown in FIG. 12, to bring the second voltage level transferred to the SEN2 down to a level normalized with the threshold voltage of the SEN2 transistor 926, for example, as described above at step 1108.

For example, in the case the memory cell 901 is in a highly conductive state such that Csen1 917 was discharged (e.g., in a programmable state), the second voltage level retained in the SEN1 node and transferred to the SEN2 node sets the gate of the SEN2 transistor 926 such that the SEN2 transistor 926 will turn OFF. That is, for example, the second voltage level is at or below the threshold voltage of the SEN2 transistor 926. Based on turning the transistor 926 off, the LBUS will have a high level, which is latched into a second data latch of the data latches 931 as a second sensing result. The high level on the LBUS is indicates that the second voltage level is below the verify voltage level VH.

Alternatively, in the case here Csen1 917 saw little or no discharge because the selected memory cell 901 is in a high resistance state (e.g., an inhibit state), the SEN2 transistor 926 will turn ON and the LBUS will discharge through the STB transistor 927 and SEN2 transistor 926. The discharge of the LBUS results in a low level, which is latched into the second data latch of the data latches 931 as the second sensing result. The low level on the LBUS indicates that the first voltage level is above the verify voltage level VH.

From the first and second sensing results the data state of the memory cell 901 can be determined. For example, the sensing circuit controller 508 can determine that the memory cell 901 is in the inhibit programming state if the first and second sensing results indicate the LBUS was at a low level (e.g., the first voltage level was above the verify voltage level VL and the second voltage level was above the verify voltage level VH). As another example, the sensing circuit controller 508 can determine that the memory cell 901 is in the weakly programmed transitory state if the first sensing result indicates the LBUS was at a low level (e.g., the first voltage level was above the verify voltage level VL), but the second sensing result indicates that the LBUS was at a high level (e.g., the second voltage level was at or below the verify voltage level VH). As yet another example, the sensing circuit controller 508 can determine that the memory cell 901 is in the programmable state if the first and second sensing results indicate the LBUS was at a high level (e.g., the first voltage level was at or below the verify voltage level VL and the second voltage level was at or below the verify voltage level VH).

The time for the sensing operation for a memory cell depends upon the time of the wordline setup, bitline settling, the sense time of discharging the SEN1 and SEN2 nodes (steps 1102-1106), and strobe time (steps 1110-1114). In the sensing scheme illustrated with respect to FIGS. 9 and 14, the time allowed to discharge the Csen1/SEN1 node (e.g., the second sensing period) should be long enough for a memory cell in the programmable state to discharge the SEN1 node to less than the threshold voltage of the XXL transistor 918. In this example, the WL 903 may be held at verify voltage level VH and the sense time for discharging SEN1 and SEN2 nodes (e.g., $t_1$ to $t_2$ and $t_1$ to $t_3$, respectively) changes threshold current of the sense amplifier 900. A longer sensor time to discharge SEN1 or SEN2 means a smaller threshold current is sufficient to turn the SEN2 transistor 926 off. In this way, when the strobe (taking the voltage on the gate of STB transistor 927 high) is applied, the line LBUS will not discharge to a low voltage level if the selected memory cell is in a programmable state. The time allowed to discharge the Csen2/SEN2 node (e.g., the first sensing period) should be long enough for a memory cell in at least the weakly programmed state (and the programmable state) to discharge the SEN2 node to less than the threshold voltage of the S2S transistor 919. In this way, when the strobe (taking the voltage on the gate of STB transistor 927 high) is applied, the line LBUS will not discharge to a low voltage level if the selected memory cell is in the weakly programmed or programmable states. The rate at which Csen1 917/Csen2 921 and the SEN1 and SEN2 nodes discharge depends upon the current flowing though the selected memory cell. The time for discharging each respective SEN node ($Tsen_i$) should be long enough to differentiate between a programmed (or weakly programmed) memory cell and an inhibit memory cells, which can be expressed as:

$$Tsen_i = (\Delta Vsen_i * Csen_i)/Ion,$$

where: Ion is the current for an ON memory cell; $\Delta Vsen_i$ is change in voltage required for the ith SEN node (e.g., SEN1 node where i=1 and SEN2 node where i=2) to discharge below the threshold voltage of a respective transistor (e.g., S2S transistor 919 or XXL transistor 918); and in this equation $Csen_i$ is the capacitance of the ith sensing capacitor (e.g., Csen1 917 and Csen2 921).

Figure 14B:
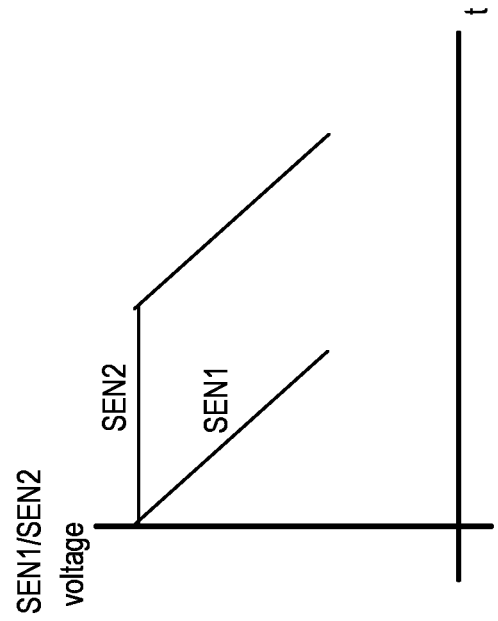
FIG. 14B illustrates a sense margin graph that illustrates voltage swing on the example architecture of FIG. 14A.
Figure 14A:
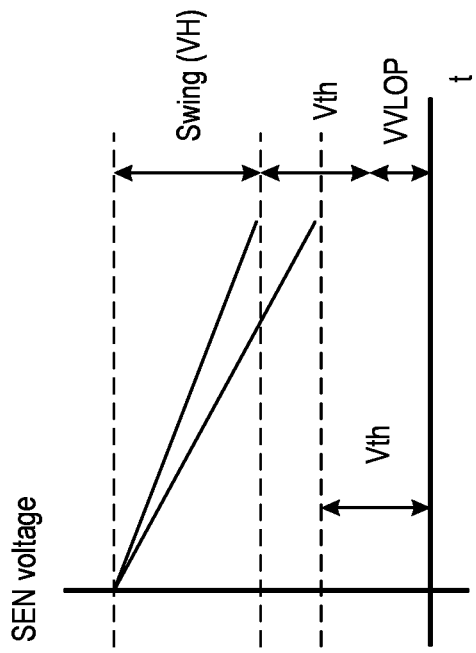
FIG. 14A illustrates an example architecture for a smart QPW (SQPW) verify scheme.

FIG. 14A illustrates an example architecture 1400 for a smart QPW (SQPW) verify scheme. FIG. 14B illustrates a sense margin graph that illustrates voltage swing on the example architecture of FIG. 14A. FIG. 14A illustrates an example of a sense amplifier architecture 1400 connected to a selected memory cell. Architecture 1400 includes a sensing node SEN connected to the top plate of a sensing capacitor, which is connected to a sense amplifier clock (CLKSA) at it bottom node. The SEN node is connected to a control gate of a transistor 1412, which is in turn connected to the level VLOP and to an LBUS (not shown) through STB transistor. The SEN node may be connected to an internal BLI similar to that described in connection with FIG. 9.

The architecture 1400 may be used to implement a SQPW verify scheme. In an example SQPW verify scheme, a one-bit-pass (OBP) scan operation is used to detect any bit pass VL after sensing and strobing of VL data. If no bit passes VL, then it will go to the next program pulsing directly. If any bit passes VL, then it will go back to the normal VL scan and do the rest like the normal QPW. In the next verify pulse, the OBP scan operation will be skipped. To implement this scheme, the VL and VL sensing can be done with one sensing strobe, for example, by modulating the VLOP level at the source of the transistor 1412. That is, when sensing the VL data, sampling the voltage level at the SEN node is done by brining STB transistor to high with VLOP at a first level (e.g., VSS level). Then, sensing the VL data involves applying an analog voltage as VLOP. This increases the threshold voltage level Vth of the transistor 1412, which in turn raises the voltage level needed at the SEN node to toggle the transistor 1412.

As shown in FIG. 14B, the threshold voltage level Vth is raised by approximately the voltage applied to the VLOP. However, this scheme reduced the voltage swing of VH sensing. The voltage swing refers to the voltage difference at the SEN node to accurately distinguish between two states of the memory cell. That is, to be able to differentiate a first cell state from a second state, the voltage difference at the sensing node needs be large enough for long enough for the sense amplifier to accurately distinguish between the two states. The smaller the difference, or voltage swing, the more vulnerable the sensing is to noise. That is, as VLOP is increased, the voltage swing is reduced, as shown in FIG. 14B. Thus, noise may increase the voltage level at the SEN node, which may inadvertently turn the transistor 1412 ON or OFF and producing an inaccurate sensing of the memory cells state.

Whereas, the embodiments of the disclosed technology as described above in connection with FIGS. 9-12, do not suffer from this technical short coming because the voltage swing for the VL sensing and VH sensing are the same. That is, the voltage difference at the SEN2 node of the embodiments disclosed herein for toggling the SEN2 transistor 926 is unchanged between first and second voltage levels (e.g., VL and VH sensing results). Instead, embodiments herein, utilize a bias recovery operation to ensure bias conditions present when a voltage level was retained (e.g., at SEN1) are recovered and present and then utilize the S2S transistor 919 to transfer the voltage levels for performing VL and VH sending.

Figure 15B:
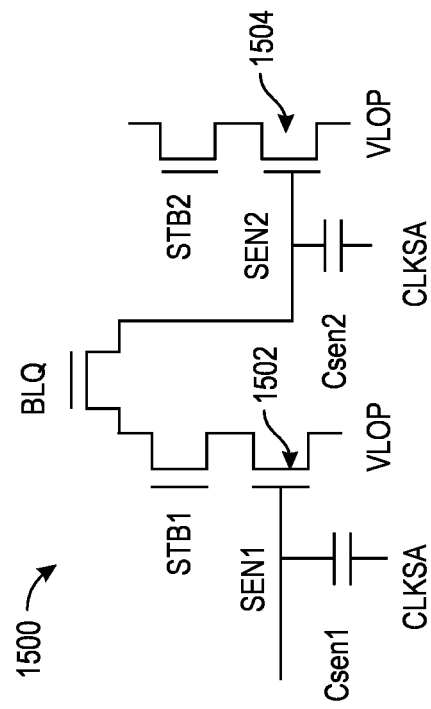
FIG. 15B illustrates a sense margin graph that illustrates the sense voltage levels of the example architecture of FIG. 15A.
Figure 15A:
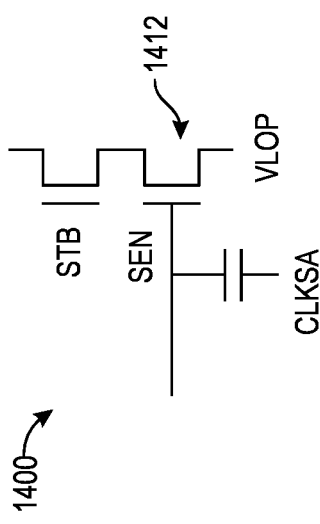
FIG. 15A illustrates an example architecture 1500 for a cascade sensing verify scheme.

FIG. 15A illustrates an example architecture 1500 for a cascade sensing verify scheme. FIG. 15B illustrates a sense margin graph that illustrates the sense voltage levels of the example architecture of FIG. 15A. FIG. 15A illustrates an example of a sense amplifier architecture 1500 connected to a selected memory cell. Architecture 1500 includes a first sensing node SEN1 connected to the top plate of a first sensing capacitor Csen1, which is connected to a CLKSA at it bottom node. The SEN1 node is connected to a control gate of a transistor 1502, which is in turn connected to the level VLOP and to BLQ transistor through first strobe transistor STB1. The SEN1 node may be connected to an internal BLI similar to that described in connection with FIG. 9. Architecture 1500 also includes a second sensing node SEN2 connected to the BLQ transistor and to the top plate of a second sensing capacitor Csen2, which is connected to the CLKSA at it bottom node. The SEN2 node is also connected to a control gate of a transistor 1504, which is in turn to connected to the level VLOP and to an LBUS (not shown) through second strobe transistor STB2.

The architecture 1500 may be used to implement a cascade sensing verify scheme. In the cascade verify sensing scheme, the two sensing capacitors Csen1 and Csen2 are used to sense the VL and VH verify voltages. For example, SEN1 node is discharged first and after SEN1 node is completely discharged, the BLQ turns on, and SEN2 node starts to discharge. If both SEN1 node and SEN2 node discharge, the memory cell is in a programmed state. If SEN1 node discharges and SEN2 does not discharge, then the memory cell is in a QPW state. If neither discharge, then the memory cell is in the inhibit state.

The cascade sensing verify scheme suffers from multiple technical short comings. First, the scheme requires extra transistors to cascade the two sensing operations. That is two transistors 1502 and 1504 are required, along with two STB transistors. This translates into additional physical chip real-estate required to implement the technique. Second, the VH sensing via SEN2 node discharge starts only after the VL sensing via SEN1 node discharge is complete, as shown in FIG. 15B. Thus, there is a timing delay in completing the sensing verification and distance between voltages levels for VL and VH sensing need to be relatively high.

Whereas, the embodiments of the disclosed technology as described above in connection with FIGS. 9-12, do not suffer from these technical short coming. Embodiments herein utilize the S2S transistor between the SEN1 and SEN2 nodes to gate the VH and VL sensing. That is, instead of two pulse for separately discharging the SEN nodes as in architecture 1500, embodiments herein utilize a single pulse applied to the XXL transistor so that the SEN1 node and SEN2 node are simultaneously discharged. Then the S2S transistor switches off so to retain the VL sensing in the SEN2 node while the SEN1 node continues to discharge. Thus, the embodiments herein require fewer transistors and, therefore, less physical chip real-estate. Furthermore, the VH sensing is not delayed by the VL sensing due to simultaneously discharging of the sensing capacitors.

While the foregoing embodiments are described in related to a verify operation during a QPW, the present disclosure is not so limited. The embodiments described in connection with FIGS. 9-12 can be extended to other verify operations for verifying a state of a memory cell where there are two or more consecutive sensing operations with different sensing levels.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system XYZ00.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for sensing a data state of a memory cell, the method comprising:
   connecting a first sensing node and a second sensing node to an internal bitline of a sensing amplifier to simultaneously discharge a first capacitor connected to the first sensing node and a second capacitor connected to the second sensing node through the memory cell;
   after a first sensing period, disconnecting the second sensing node from the internal bitline, wherein the second sensing node includes a first voltage level based on discharging the second capacitor;
   after a second sensing period, disconnecting the first sensing node from the internal bitline, wherein the first sensing node includes a second voltage level based on discharging the first capacitor; and
   latching a first sensing result and a second sensing result based on the first and second voltage levels, respectively, wherein a data state of the memory cell is based on the first and second voltage levels, and wherein the second sensing period comprises the first sensing period and is longer than the first sensing period.

2. The method of claim 1, further comprising:
   latching the first sensing result based on the first voltage level of the second sensing node;
   after latching the first sensing result, connecting the second sensing node to the first sensing node to transfer the second voltage level to the second sensing node; and
   latching the second sensing result based on the transferred second voltage level of the second sensing node.

3. The method of claim 2, further comprising:
   performing a clock down operation responsive to disconnecting the first sensing node from the internal bitline; and
   responsive to latching the first sensing result, recovering bias conditions that were present on the first and second sensing nodes prior to disconnecting the second sensing node from the internal bitline and, wherein
   connecting the second sensing node to the first sensing node is responsive to recovering the bias conditions.

4. The method of claim 1, wherein
   the data state of the memory cell is an inhibit state when the first voltage level is less than or equal to a first verify voltage level and the second voltage level is less than or equal to a second verify voltage level higher than the first verify voltage level;
   the data state of the memory cell is a weakly programmed state when the first voltage level is less than or equal to the first verify voltage level and the second voltage level is greater than the second verify voltage level; and
   the data state of the memory cell is a programmable state when the first voltage level is greater than the first verify voltage level and the second voltage level is greater than the second verify voltage level.

5. The method of claim 1, wherein connecting the first sensing node and the second sensing node to the internal bitline comprises bringing a first switch between the first sensing node and the internal bitline high.

6. The method of claim 5, wherein disconnecting the second sensing node from the internal bitline comprises bringing a second switch between the first sensing node and the second sensing node to low.

7. The method of claim 5, wherein disconnecting the first sensing node from the internal bitline comprises bringing the first switch to low.

8. The method of claim 1, wherein a first plate of the first capacitor is connected to the first sensing node and a second plate of the first capacitor is connected to a bus.

9. A non-transitory computer-readable medium storing a plurality of instructions executable by one or more processors, the plurality of instructions when executed by the one or more processors cause the one or more processors to perform a method comprising:
   connecting a first sensing node and a second sensing node to an internal bitline of a sensing amplifier to simultaneously discharge a first capacitor connected to the first sensing node and a second capacitor connected to the second sensing node through a memory cell;
   after a first sensing period, disconnecting the second sensing node from the internal bitline, wherein the second sensing node includes a first voltage level based on discharging the second capacitor;
   after a second sensing period, disconnecting the first sensing node from the internal bitline, wherein the second sensing node include a second voltage level based on discharging the first capacitor; and
   latching a data state of the memory cell based on the first and second voltage levels, wherein disconnecting the second sensing node from the internal bitline comprises bringing a second switch between the first sensing node and the second sensing node to low.

10. The non-transitory computer readable medium of claim 9, wherein the second sensing period comprises the first sensing period and is longer than the first sensing period.

11. The non-transitory computer readable medium of claim 9, further comprising:
    latching a first sensing result based on the first voltage level of the second sensing node;
    after latching the first sensing result, connecting the second sensing node to the first sensing node to transfer the second voltage level to the second sensing node; and
    latching a second sensing result based on the transferred second voltage level of the second sensing node.

12. The non-transitory computer readable medium of claim 11, further comprising:
    performing a clock down operation responsive to disconnecting the first sensing node from the internal bitline; and
    responsive to latching the first sensing result, recovering bias conditions that were present on the first and second sensing nodes prior to disconnecting the second sensing node from the internal bitline and, wherein
    connecting the second sensing node to the first sensing node is responsive to recovering the bias conditions.

13. The non-transitory computer readable medium of claim 9, wherein
    the data state of the memory cell is an inhibit state when the first voltage level is less than or equal to a first verify voltage level and the second voltage level is less than or equal to a second verify voltage level higher than the first verify voltage level;
    a transitory data state of the memory cell is a weakly programmed state when the first voltage level is less than or equal to the first verify voltage level and the second voltage level is greater than the second verify voltage level; and the data state of the memory cell is a programmable state when the first voltage level is greater than the first verify voltage level and the second voltage level is greater than the second verify voltage level.

14. The non-transitory computer readable medium of claim 9, wherein connecting the first sensing node and the second sensing node to the internal bitline comprises bringing a first switch between the first sensing node and the internal bitline high.

15. The non-transitory computer readable medium of claim 14, wherein disconnecting the first sensing node from the internal bitline comprises bringing the first switch to low.

16. A sense amplifier comprising:
a first capacitor having a first plate connected to a first node and a second plate connected to a bus;
a second capacitor having a first plate connected to a second node;
a first switch connected between the first and second nodes;
a second switch connected to the first node and an internal bitline;
at least one control circuit connected to the first and second switches, the control circuit configured to execute operations to:
turn on the second switch to connect the first and second capacitors to the internal bitline to discharge the first and second capacitors through the internal bitline;
after a first sensing period, turn off the first switch to disconnect the second capacitor from the internal bitline;
after a second sensing period, turn off the second switch to disconnect the first capacitor from the internal bitline; and
latching a first sensing result to a first data latch based on a first verify voltage level and a second sensing result to a second data latch based on a second verify voltage level;
wherein:
the first verify voltage level is based on discharging the second capacitor;
the second verify voltage level is based on discharging the first capacitor; and
the second sensing period comprises the first sensing period and is longer than the first sensing period.

17. The sense amplifier of claim 16, wherein the control circuit is further configured to:
turn on the first switch responsive to latching the first sensing result in the first data latch; and
latch the second sensing result to the second data latch based on transferring the second verify voltage level to the second capacitor responsive to tunning on the first switch.

18. The sense amplifier of claim 16, wherein the first verify voltage level is lower than the second verify voltage level.

19. The sense amplifier of claim 16, the control circuit is further configured to:
pre-charge the first plate of the first capacitor and the first plate of the second capacitor, wherein
turning on the second switch is subsequent to pre-charging the first plate of the first capacitor and the first plate of the second capacitor.

20. The sense amplifier, wherein a second plate of the second capacitor is connected to the first verify voltage level.

* * * * *